(12) United States Patent
Ito et al.

(10) Patent No.: US 11,616,120 B2
(45) Date of Patent: Mar. 28, 2023

(54) SEMICONDUCTOR SUBSTRATE, METHOD OF MANUFACTURING SEMICONDUCTOR DEVICE, AND METHOD OF MANUFACTURING SEMICONDUCTOR SUBSTRATE

(71) Applicant: Kioxia Corporation, Tokyo (JP)

(72) Inventors: Fuyuma Ito, Yokkaichi (JP); Tatsuhiko Koide, Kuwana (JP); Hiroki Nakajima, Mie (JP); Naomi Yanai, Kuwana (JP); Tomohiko Sugita, Yokkaichi (JP); Hakuba Kitagawa, Yokkaichi (JP); Takaumi Morita, Kuwana (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/196,186

(22) Filed: Mar. 9, 2021

(65) Prior Publication Data

US 2022/0085153 A1 Mar. 17, 2022

(30) Foreign Application Priority Data

Sep. 15, 2020 (JP) .............................. JP2020-154443

(51) Int. Cl.
*H01L 29/06* (2006.01)
*H01L 21/02* (2006.01)
*H01L 27/06* (2006.01)
*H01L 21/768* (2006.01)

(52) U.S. Cl.
CPC ........ *H01L 29/06* (2013.01); *H01L 21/02019* (2013.01); *H01L 21/76802* (2013.01); *H01L 27/0688* (2013.01)

(58) Field of Classification Search
None
See application file for complete search history.

(56) References Cited

U.S. PATENT DOCUMENTS

| | | | | |
|---|---|---|---|---|
| 6,806,138 | B1 * | 10/2004 | Cheng ................... | H01L 29/945 438/386 |
| 2004/0188739 | A1 * | 9/2004 | Takenaka .......... | H01L 27/10829 257/E21.396 |
| 2005/0224852 | A1 * | 10/2005 | Cheng ............... | H01L 29/66181 257/E21.396 |
| 2008/0057414 | A1 | 3/2008 | Han | |
| 2010/0248449 | A1 | 9/2010 | Hildreth et al. | |
| 2015/0069581 | A1 * | 3/2015 | Chang ................. | H01L 21/2633 438/712 |
| 2015/0076505 | A1 * | 3/2015 | Ke ........................ | H01L 33/005 438/29 |

(Continued)

FOREIGN PATENT DOCUMENTS

| | | |
|---|---|---|
| JP | 59-28368 A | 2/1984 |
| JP | 10-64776 A | 3/1998 |

(Continued)

*Primary Examiner* — Khaja Ahmad
(74) *Attorney, Agent, or Firm* — Oblon, McClelland, Maier & Neustadt, L.L.P.

(57) ABSTRACT

A semiconductor substrate includes a surface having a groove. The groove includes an inner bottom surface and an inner wall surface. The inner wall surface has a depression. The depression has a depth from a direction along a surface of the inner wall surface to a width direction of the groove. The substrate being exposed to the inner wall surface.

7 Claims, 22 Drawing Sheets

(56) References Cited

U.S. PATENT DOCUMENTS

| | | |
|---|---|---|
| 2015/0376789 A1 | 12/2015 | Motoyama et al. |
| 2016/0133698 A1* | 5/2016 | Chou ................. H01L 29/7393 |
| | | 257/506 |
| 2016/0181121 A1 | 6/2016 | Weisse et al. |
| 2016/0233176 A1 | 8/2016 | Kato |
| 2017/0084452 A1 | 3/2017 | Yang et al. |

FOREIGN PATENT DOCUMENTS

| | | |
|---|---|---|
| JP | 2000-100675 A | 4/2000 |
| KE | 2005-340597 A | 12/2005 |
| KR | 10-2015-0131446 A | 11/2015 |
| WO | WO 2010/114887 A1 | 10/2010 |
| WO | WO 2015/012874 A1 | 1/2015 |
| WO | WO 2020/189421 A1 | 9/2020 |

\* cited by examiner

SEMICONDUCTOR SUBSTRATE, METHOD OF MANUFACTURING SEMICONDUCTOR DEVICE, AND METHOD OF MANUFACTURING SEMICONDUCTOR SUBSTRATE

CROSS-REFERENCE TO RELATED APPLICATION

This application is based upon and claims the benefit of priority from Japanese Patent Application No. 2020-154443, filed on Sep. 15, 2020; the entire contents of which are incorporated herein by reference.

FIELD

Embodiments relate to a semiconductor substrate, a method of manufacturing a semiconductor device, and a method of manufacturing a semiconductor substrate.

BACKGROUND

Some semiconductor products are manufactured using a Non Product Wafer (NPW) on which a semiconductor device is not formed. A known example of the semiconductor device is formed by three-dimensionally arranging a memory cell on a semiconductor wafer.

DETAILED DESCRIPTION

Figure 1:
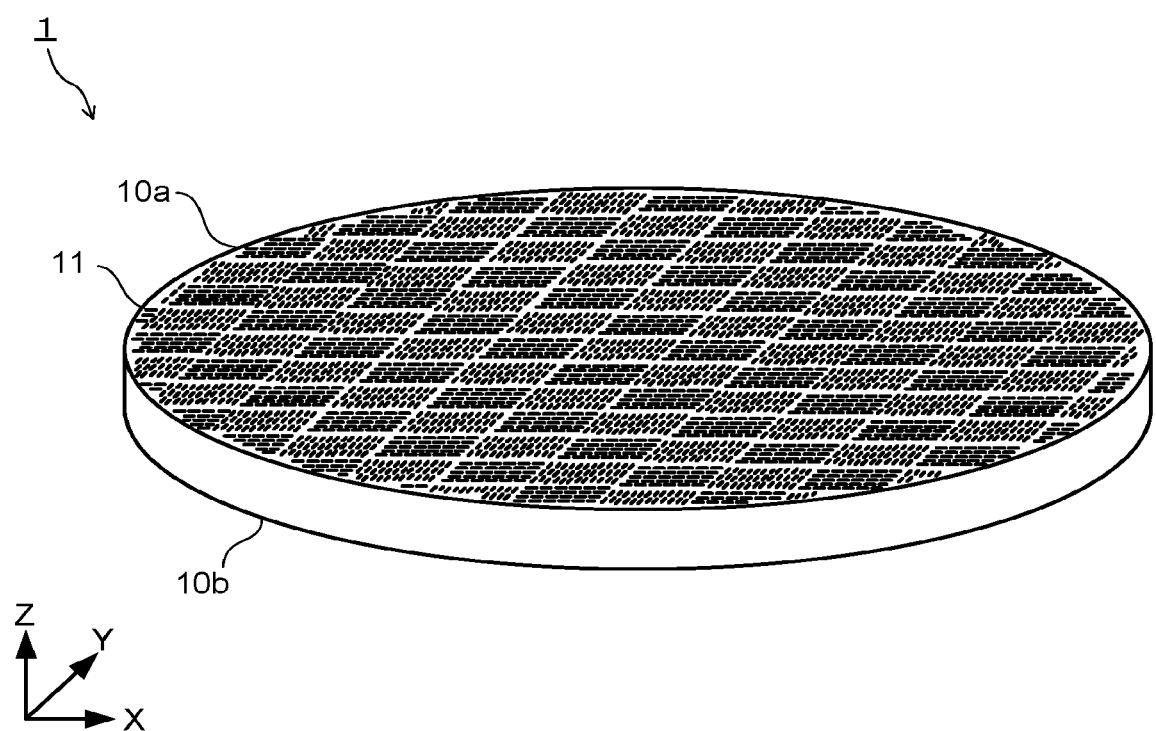
FIG. 1 is a schematic view of an external appearance of a semiconductor wafer.

A semiconductor substrate includes a surface having a groove. The groove includes an inner bottom surface and an inner wall surface. The inner wall surface has a depression. The depression has a depth from a direction along a surface of the inner wall surface to a width direction of the groove. The substrate being exposed to the inner wall surface.

Embodiments will be hereinafter described with reference to the drawings. The relation of thickness and planer dimension of each constituent element, a thickness ratio among the constituent elements, and so on described in the drawings may be different from actual ones. Further, in the embodiments, substantially the same constituent elements are denoted by the same reference signs, and a description thereof will be appropriately omitted.

First Embodiment

Figure 2:
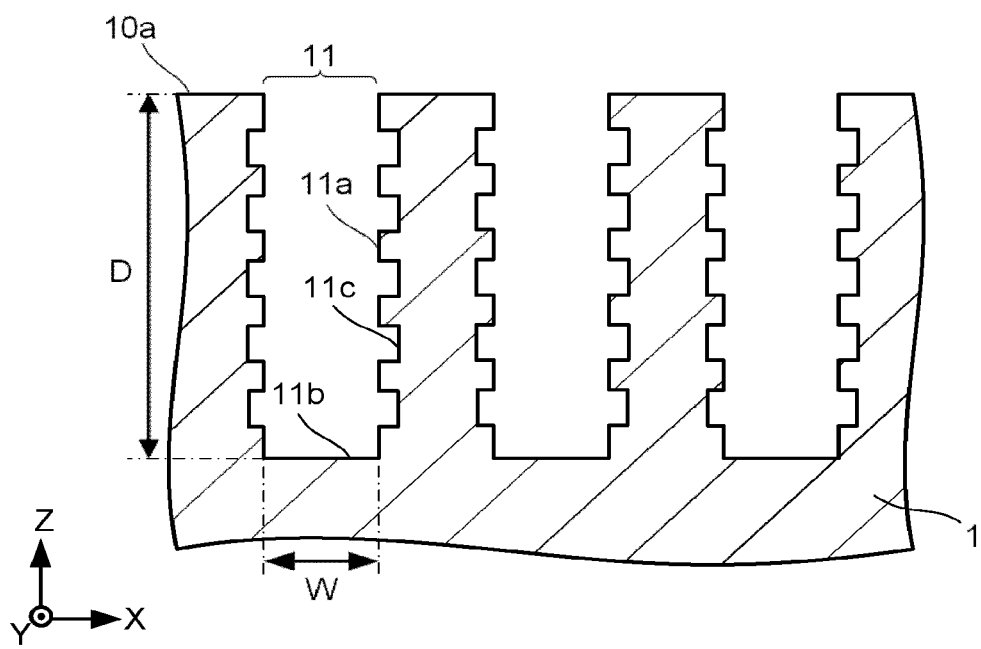
FIG. 2 is a schematic sectional view illustrating a structural example of a semiconductor wafer.
Figure 3:
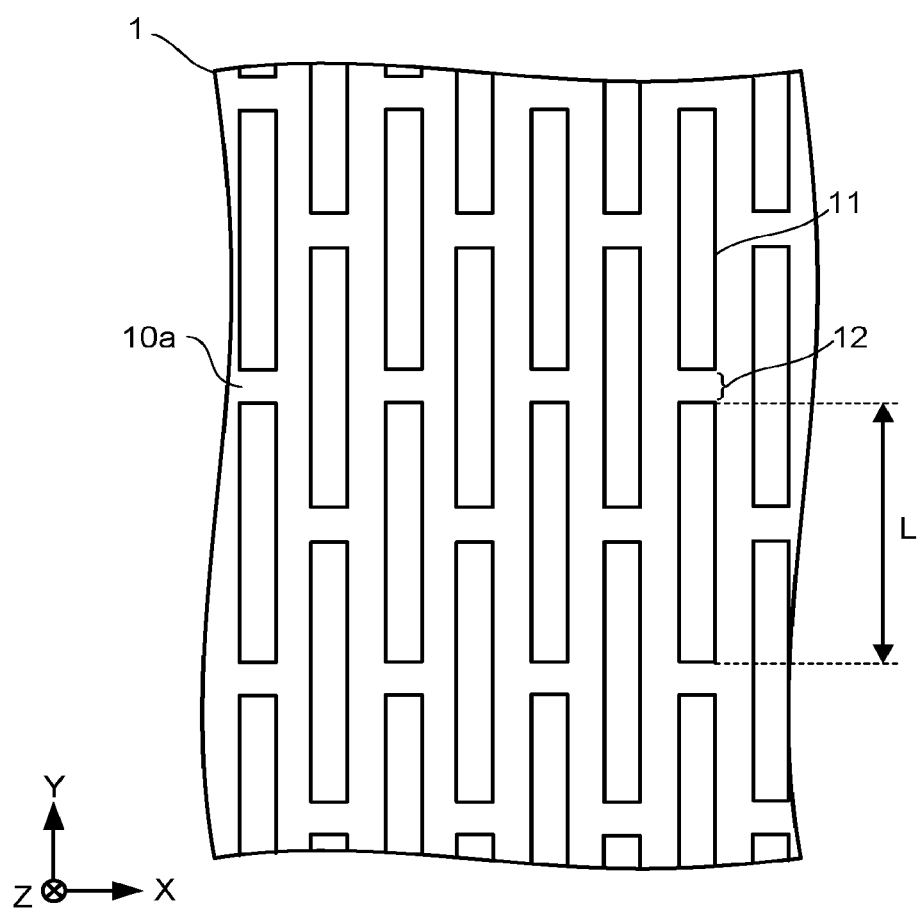
FIG. 3 is a schematic upper view illustrating a structural example of a semiconductor wafer.

FIG. 1 is a schematic view of an external appearance of a semiconductor wafer being a semiconductor substrate, and FIG. 2 is a schematic sectional view illustrating a structural example of a semiconductor wafer, in which a part of an X-Z cross section including an X axis and a Z axis which is orthogonal to the X axis and a Y axis is illustrated. FIG. 3 is a schematic upper view illustrating a structural example of a semiconductor wafer, in which a part of an X-Y plane including an X axis of the semiconductor wafer and a Y axis which is orthogonal to the X axis is illustrated.

The semiconductor wafer 1 is the NPW, and is a wafer which is used for previously evaluating and measuring film formation, etching, and other various processes when manufacturing a semiconductor. For example, the semiconductor wafer 1 is used for evaluating and measuring a film formation process such as chemical vapor deposition (CVD) in which a source gas is made to react with a wafer surface to form a thin film, and atomic layer deposition (ALD), or an etching process such as chemical dry etching (CDE) in which plasma is supplied to a wafer surface to perform etching on a film, atomic layer etching (ALE) in which a source gas is supplied to a surface to perform etching on a film, and wet etching in which liquid is supplied to perform etching on a film. Alternatively, the semiconductor wafer 1 is also used for reproducibility tests for the processes, and the like. Alternatively, the semiconductor wafer 1 is sometimes processed in a processing chamber same as that of a wafer having a semiconductor device formed thereon. The semiconductor wafer 1 can also be referred to as a dummy wafer, a test piece, or the like.

The semiconductor wafer 1 includes a surface 10a extending in the X axis direction and the Y axis direction, and a surface 10b being an opposite surface of the surface 10a. A surface area of the surface 10a is preferably about the same as a surface area of a device formation surface of a semiconductor wafer on which a semiconductor device is already formed or in the middle of the formation. Examples of the semiconductor wafer 1 include a silicon wafer, a silicon carbide wafer, a glass wafer, a quartz wafer, a sapphire wafer, a compound semiconductor wafer such as a GaAs substrate, and the like. A shape of the semiconductor wafer 1 is not limited to the shape illustrated in FIG. 1, and it may be one having an orientation flat, for example.

The surface 10a has a pattern including at least one groove 11. The groove 11 includes an inner wall surface 11a and an inner bottom surface 11b. The semiconductor wafer 1 is exposed to the inner wall surface 11a and the inner bottom surface 11b. When plural grooves 11 are provided, the plural grooves 11 are arranged side by side along the X axis direction of the surface 10a as illustrated in FIG. 2, and are extended in a line shape along the Y axis direction of the surface 10a. A length L of the groove 11 in a long-side direction is 4 μm or more, for example, and is preferably 40 μm or more. An interval between the grooves 11 which are adjacent along the X axis direction is 0.4 μm or more and 14 μm or less, for example, and is preferably 1 μm or less. End portions of the grooves 11 which are adjacent along the X axis direction may be displaced from each other along the Y axis direction.

The shape of the groove 11 is not limited to the line shape. The shape of the groove 11 may also be a hole shape, for example.

The inner wall surface 11a has a depression 11c. The depression 11e is exposed. Plural depressions 11c are spaced along a depth direction of the groove 11. The depression 11c has a depth from a direction along a surface of the inner wall surface 11a (Z axis direction) to a width direction of the groove 11 (X axis direction). Specifically, the inner wall surface 11a has a concavity/convexity structure along the depth direction. A length of the depression 11c in the Z axis direction (a width of the depression 11c) is, for example, 100 nm or more and 2000 nm or less. A length of the depression 11c in the X axis direction (a depth of the depression 11c) is, for example, 10 nm or more and 200 nm or less.

An aspect ratio of the groove 11 is 50 or more and 1750 or less, for example. The aspect ratio is defined by a ratio of a depth D of the groove 11 to a width W of the groove 11 illustrated in FIG. 3. The width W of the groove 11 is, for example, 0.4 μm or more and 14 μm or less. The depth D of the groove 11 is, for example, 20 μm or more and a thickness of the semiconductor wafer 1 or less, and the groove 11 may penetrate the wafer 1. A surface area of the surface 10a is, for example, 50 times or more, and preferably 100 times or more a surface area in a case where the groove 11 is not formed. Specifically, it can be said that when the groove or the like is not formed on the surface 10b, the surface area of the surface 10a is 50 times or more, and preferably 100 times or more a surface area of the surface 10b.

It is preferable that the groove 11 has the depth D from the surface 10a of 20 μm or more and the aspect ratio of 50 or more, for example. This makes it possible to increase the surface area of the surface 10a, and to realize the groove 11 with which a film formed on the surface 10a is easily removed.

The groove 11 may also be formed via a partition wall 12. When the length L, the depth D, and the aspect ratio of the groove 11 become large, the groove 11 is likely to collapse to deform. In contrast to this, by providing the partition wall 12, the partition wall 12 functions as a beam, which enables to support the groove 11, and thus it is possible to suppress the deformation of the groove 11.

In order to suppress the deformation of the groove 11, the partition wall 12 is preferably provided at intervals of 100 μm or more, for example, in the Y axis direction. Further, lengths of plural partition walls 12 in the Y axis direction are preferably the same. Besides, it is possible that positions of the partition walls 12 between the grooves 11 adjacent in the X axis direction, are displaced to each other along the Y axis direction and regions between the adjacent grooves 11 are connected via the partition wall 12, as illustrated in FIG. 2.

Figure 4:
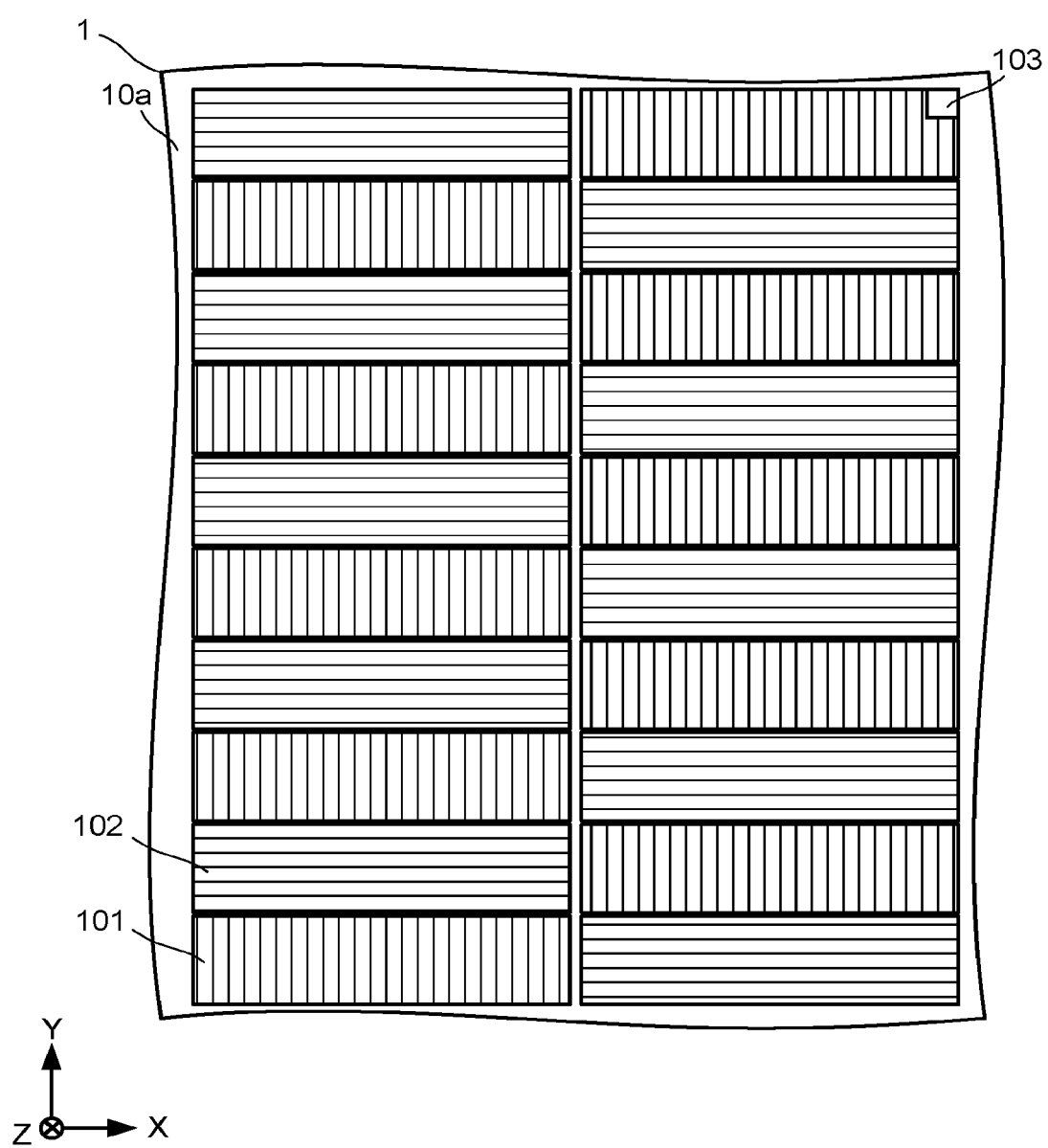
FIG. 4 is a schematic upper view illustrating a structural example of a semiconductor wafer.

The groove 11 may also include plural grooves which extend along mutually different directions. FIG. 4 is a schematic upper view illustrating a structural example of the semiconductor wafer 1, and it illustrates a part of an X-Y plane. The surface 10a of the semiconductor wafer 1 illustrated in FIG. 4 includes a region 101 and a region 102. The region 101 and the region 102 are alternately arranged along the X axis direction and the Y axis direction, for example. An interval between the region 101 and the region 102 is 2 μm or more, for example. FIG. 4 illustrates one shot region, out of plural shot regions formed on the surface 10a.

Figure 5:
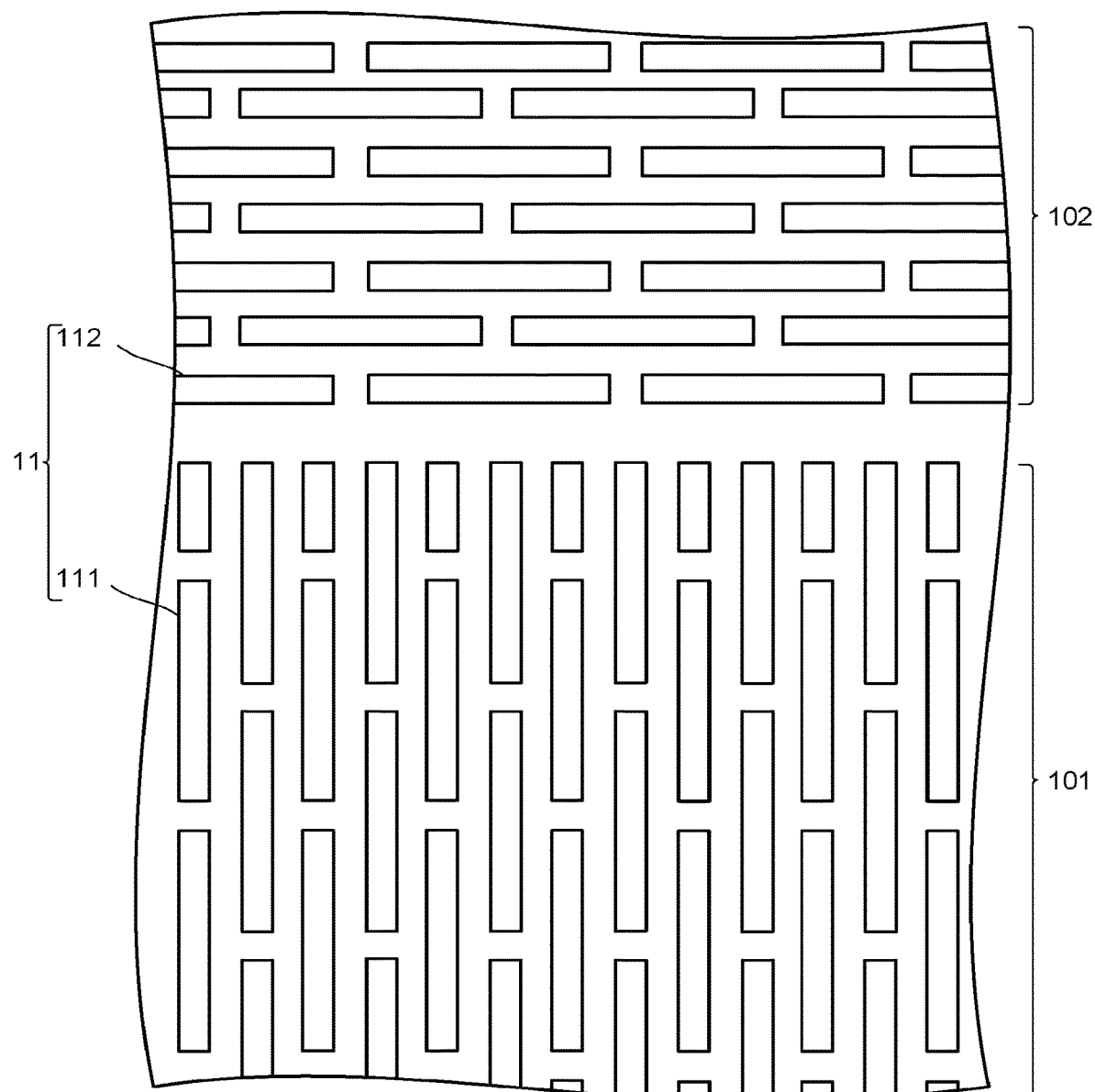
FIG. 5 is a schematic upper view illustrating a boundary part between a region 101 and a region 102.

FIG. 5 is a schematic upper view illustrating a boundary part between the region 101 and the region 102. The region 101 has grooves 111, and the region 102 has grooves 112. The plural grooves 111 are arranged side by side along the X axis direction, and extended along the Y axis direction. The plural grooves 112 are arranged side by side along the Y axis direction, and extended along the X axis direction. The extending direction (the length L direction) of the groove 111 and the extending direction (the length L direction) of the groove 112 are not limited to directions orthogonal to each other, but they may be directions which intersect each other. The groove 111 and the groove 112 are included in the groove 11. Therefore, for the other explanation of the groove 111 and the groove 112, the explanation of the groove 11 can be appropriately cited. The structure of the surface 10a described above may also be formed on the surface 10b.

As described above, the semiconductor wafer 1 can be used as a test piece on which a film is formed and evaluation is performed thereon. Alternatively, the semiconductor wafer 1 can also be used as a test piece on which a film is formed, etching is then performed and evaluation is performed thereon. At this time, the semiconductor wafer 1 has a pair of surfaces with different surface areas, and a difference in an amount of film formation on the pair of surfaces is large, and thus warpage of the semiconductor wafer 1 is likely to occur. Accordingly, when, tentatively, all of the plural grooves 11 extend in the same direction, a stress is applied in one direction, resulting in that warpage of the semiconductor wafer 1 is likely to be increased. In contrast to this, by making the plural grooves 11 extend in plural directions, it is possible to suppress the warpage of the semiconductor wafer 1 by dispersing the directions in which the stress is applied.

The semiconductor wafer 1 can be repeatedly used as the test piece. Specifically, it is also possible to continuously perform a film formation step on the semiconductor wafer 1, or continuously perform a film formation step and an etching step on the semiconductor wafer 1. The surface area becomes large because of the depressions 11c provided to the inner wall surface 11a of the groove 11, so that even when the film formation is continuously performed, it is possible to suppress the change in the surface area, and even when the etching is performed, it is easy to remove a film.

The surface 10a may further have a region 103, as illustrated in FIG. 4. The region 103 is preferably a flat surface having no groove 11. Since the region 103 is the flat surface, it is possible to measure, at the region 103, a thickness, a density, and a composition of a film to be formed on the surface 10a, for example, by using a measuring device such as a spectral ellipsometer, an X-ray photoelectron spectroscopy (XPS), a fluorescent X-ray analysis, or a Fourier transform infrared spectrophotometer (FTIR) with a minimum measurement region larger than a flat part provided between the grooves 11. An area of the region 103 may be smaller than an area of the region 101 or an area of the region 102, for example. The region 103 is formed for each of plural shot regions of the surface 10a, for example.

As described above, by controlling the shape of the groove for increasing the surface area, the semiconductor wafer 1 can realize the groove 11 which is difficult to be deformed. Accordingly, it is possible to suppress the change in the surface area when repeatedly using the semiconductor wafer 1. It is possible to provide a semiconductor wafer having a larger surface area. The dimension of the groove 11 described above is preferably set according to the type and the film thickness of the film to be formed.

The semiconductor wafer 1 can be manufactured by using Metal-assisted Chemical Etching (MACE), for example. The MACE is a technique in which a substrate having a catalyst layer formed on a surface thereof is immersed in a chemical solution, to thereby perform etching only on a region which is brought into contact with the catalyst layer.

FIG. 6 to FIG. 10 are views for explaining an example of a method of manufacturing a semiconductor wafer. The example of the method of manufacturing the semiconductor wafer includes a catalyst layer formation step, an etching step, and a catalyst layer removal step.

Figure 6:
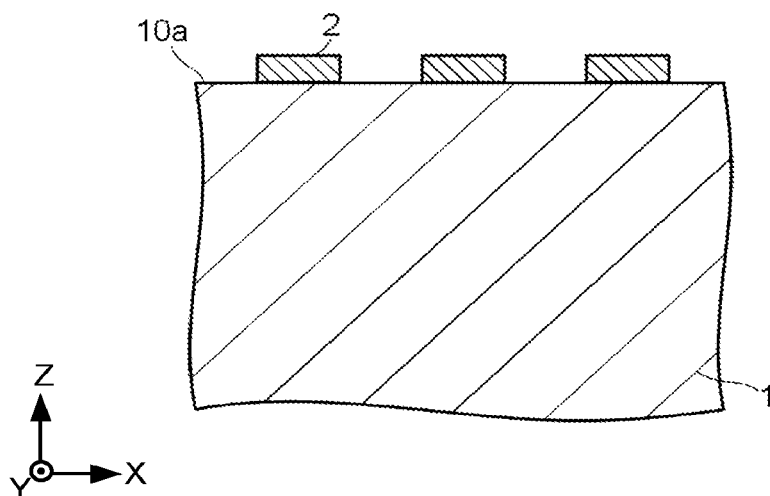
FIG. 6 is a schematic view for explaining an example of a method of manufacturing a semiconductor wafer.

In the catalyst layer formation step, a catalyst layer 2 is formed on the surface 10a of the semiconductor wafer 1, as illustrated in FIG. 6. The catalyst layer 2 contains a catalyst of noble metal such as, for example, gold, silver, platinum, iridium, or palladium. The catalyst layer 2 can be formed by using, for example, sputtering, a CVD method, a plating method, or the like. The catalyst layer 2 may also contain a catalyst of a carbon material such as graphene.

In the etching step, the semiconductor wafer 1 is immersed in a first etching solution. As the first etching solution, it is possible to use a mixed solution of hydrofluoric acid and a hydrogen peroxide solution, for example.

Figure 7:
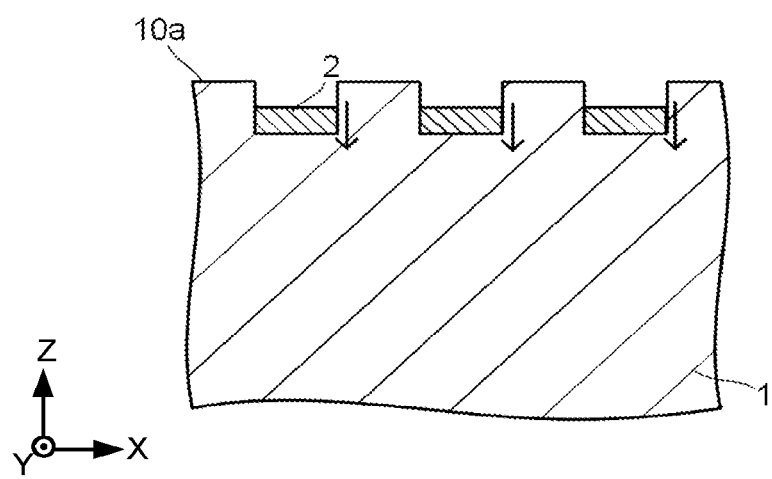
FIG. 7 is a schematic view for explaining the example of the method of manufacturing the semiconductor wafer.

When the semiconductor wafer 1 is immersed in the first etching solution, a material (silicon, for example) of the surface 10a is dissolved in the etching solution, at a contact portion between the surface 10a and the catalyst layer 2. When this reaction repeatedly occurs, the semiconductor wafer 1 is etched almost vertically, as illustrated in FIG. 7.

In addition to that, in the etching step, the semiconductor wafer 1 is immersed in a second etching solution. As the second etching solution, it is possible to use a mixed solution of hydrofluoric acid and a hydrogen peroxide solution, for example.

Figure 8:
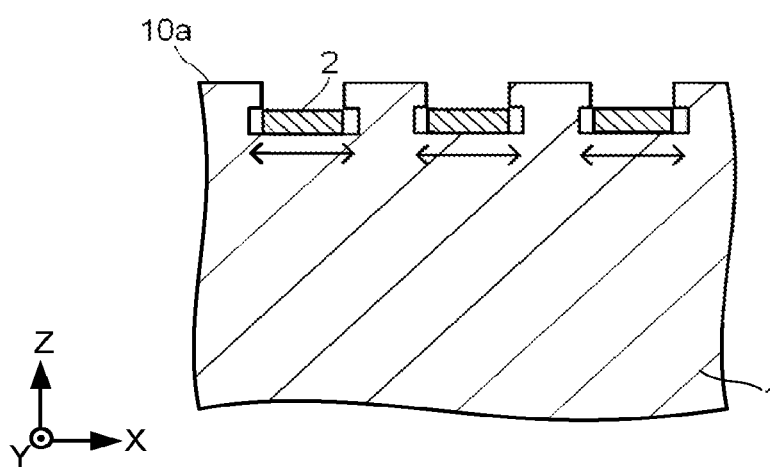
FIG. 8 is a schematic view for explaining the example of the method of manufacturing the semiconductor wafer.

A concentration of hydrogen fluoride in the second etching solution is lower than a concentration of hydrogen fluoride in the first etching solution. The concentration of hydrogen fluoride in the first etching solution is preferably 5.0 mass % or more and 20.0 mass % or less. The concentration of hydrogen fluoride in the second etching solution is preferably 1.0 mass % or more and 3.0 mass % or less. When the semiconductor wafer 1 is immersed in the second etching solution having the concentration, the material (silicon, for example) of the surface 10a is dissolved in the etching solution, at the contact portion between the surface 10a and the catalyst layer 2. When this reaction repeatedly occurs, the semiconductor wafer 1 is etched in a substantially parallel manner, as illustrated in FIG. 8.

Figure 9:
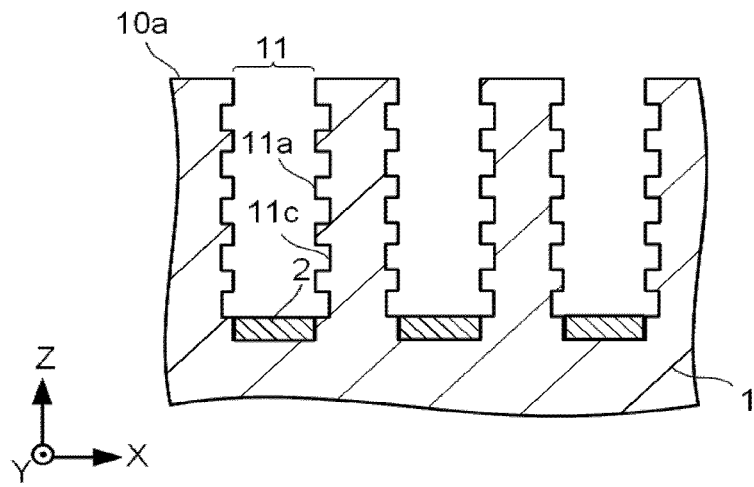
FIG. 9 is a schematic view for explaining the example of the method of manufacturing the semiconductor wafer.

Further, by alternately switching the MACE using the first etching solution and the MACE using the second etching solution, it is possible to form the groove 11 having the inner wall surface 11a and the depressions 11c, as illustrated in FIG. 9.

Figure 10:
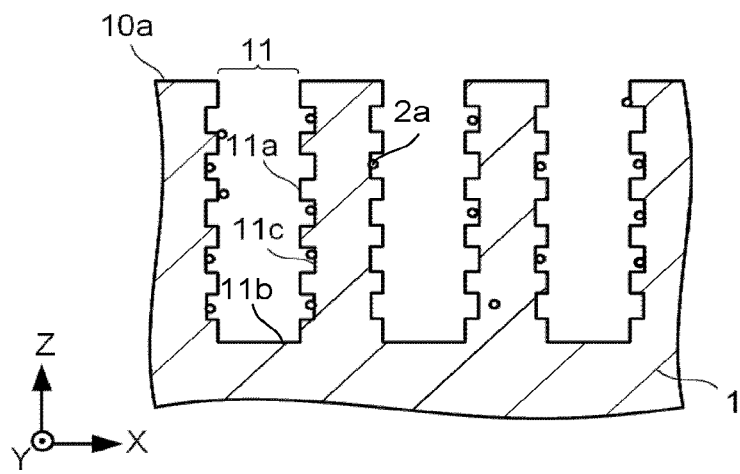
FIG. 10 is a schematic view for explaining the example of the method of manufacturing the semiconductor wafer.

In the catalyst layer removal step, the catalyst layer 2 is removed from the surface 10a, as illustrated in FIG. 10. The catalyst layer 2 is removed by impregnating the semiconductor wafer 1 with a chemical solution such as a mixed solution of hydrochloric acid and nitric acid (aqua regia) or the like, for example.

Even when the catalyst layer 2 is removed, a slight amount of catalyst atoms 2a contained in the catalyst layer 2 sometimes remains inside or on a surface of the semiconductor wafer 1, as illustrated in FIG. 10. An amount of the catalyst atoms 2a with respect to the surface area of the semiconductor wafer 1 after removal of the catalyst layer 2 is, for example, $1\times10^{11}$ atoms/cm$^2$ or less.

Figure 11:
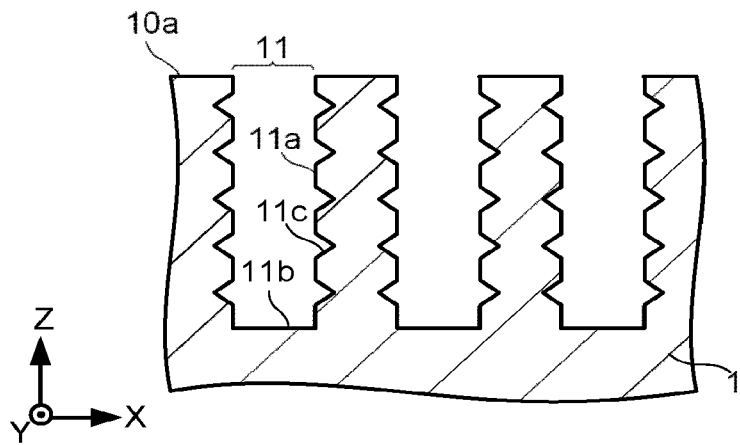
FIG. 11 is a schematic sectional view illustrating an example of another shape of a depression 11c.

A shape of the depression 11c is controlled by adjusting parameters such as a size of the catalyst layer 2, the concentration of hydrogen fluoride in the second etching solution, and an etching time, for example. For instance, FIG. 11 is a schematic sectional view illustrating an example of another shape of the depression 11c. As illustrated in FIG. 11, the depression 11c may also have a V-shape in a cross-sectional view.

As described above, in the present embodiment, by forming the depressions 11c on the groove 11, it is possible to increase the surface area of the semiconductor wafer 1.

Further, by manufacturing the semiconductor wafer 1 through the MACE, even when the depression 11c is formed, it can be easily formed.

Second Embodiment

In the present embodiment, examples of another shape of the groove 11 will be described. Each of FIG. 12 to FIG. 15 is a schematic view illustrating an example of another shape of the groove 11, and illustrates a part of an X-Y plane of the semiconductor wafer 1. The explanation can be appropriately cited for a part same as that of the explanation of the semiconductor wafer 1 described above.

Figure 12:
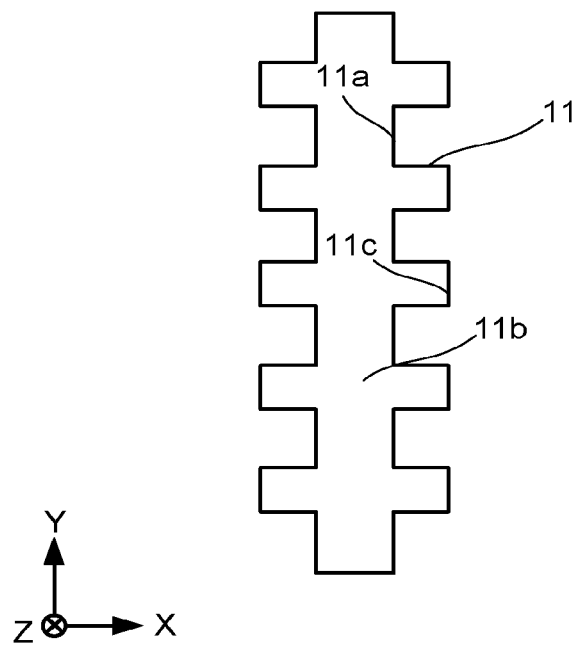
FIG. 12 is a schematic sectional view illustrating an example of another shape of the groove 11.
Figure 13:
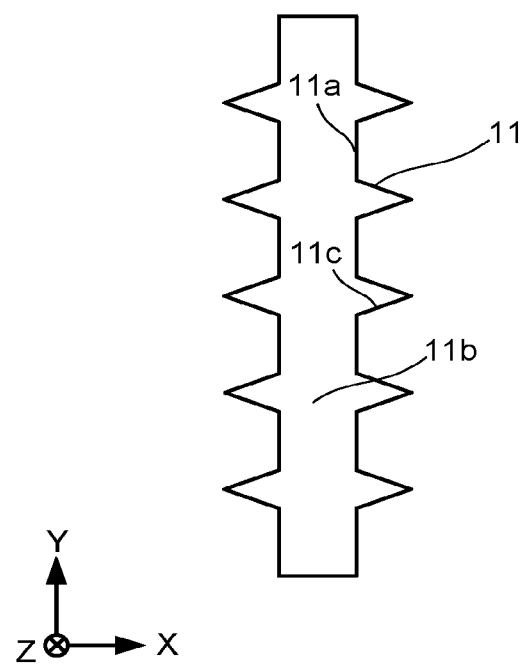
FIG. 13 is a schematic sectional view illustrating an example of another shape of the groove 11.
Figure 14:
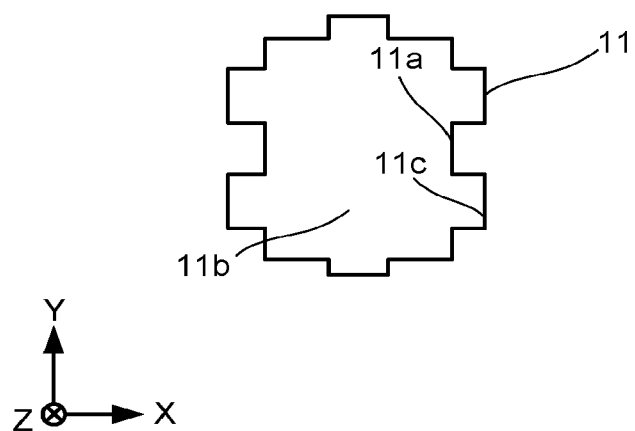
FIG. 14 is a schematic sectional view illustrating an example of another shape of the groove 11.
Figure 15:
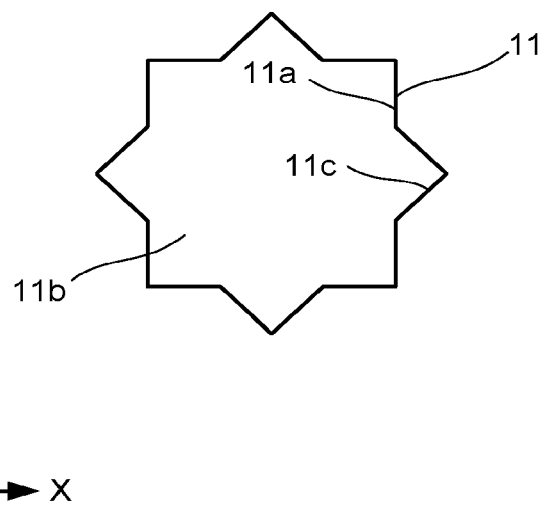
FIG. 15 is a schematic sectional view illustrating an example of another shape of the groove 11.

The groove 11 illustrated in FIG. 12 has a line shape, and an inner wall surface 11a of the groove 11 has depressions 11c. The groove 11 illustrated in FIG. 13 has a line shape, and an inner wall surface 11a of the groove 11 has V-shaped depressions 11c in a plan view. The groove 11 illustrated in FIG. 14 has a hole shape, and an inner wall surface 11a of the groove 11 has depressions 11c. The groove 11 illustrated in FIG. 15 has a hole shape, and an inner wall surface 11a of the groove 11 has V-shaped depressions 11c in a plan view. The respective plural depressions 11c are arranged with an interval provided therebetween, along an inner periphery of the groove 11. The inner wall surface 11a, an inner bottom surface 11b, and the depressions 11c are exposed.

Figure 16:
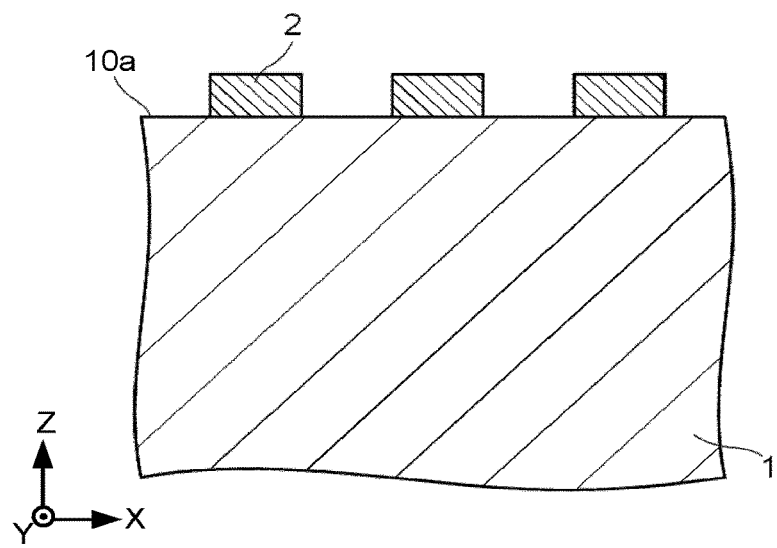
FIG. 16 is a view for explaining an example of a method of manufacturing a semiconductor wafer 1 including a surface 10a including the groove 11 having a shape illustrated in each of FIG. 12 to FIG. 15.
Figure 17:
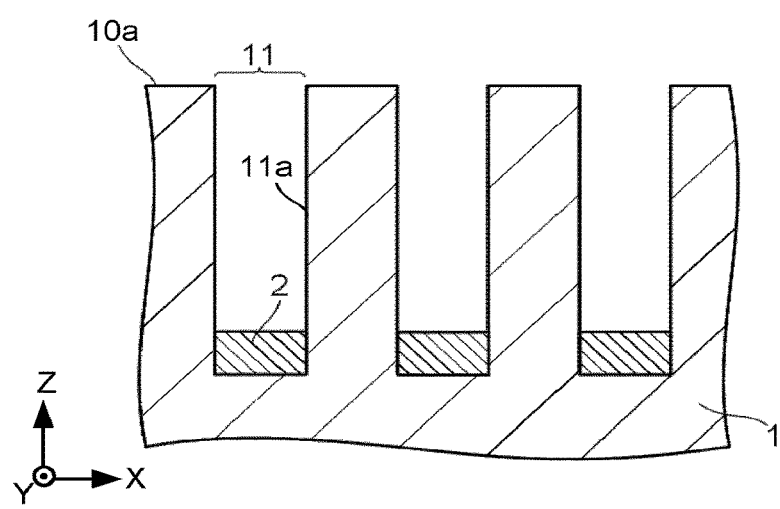
FIG. 17 is a view for explaining the example of the method of manufacturing the semiconductor wafer 1 including the surface 10a including the groove 11 having the shape illustrated in each of FIG. 12 to FIG. 15.
Figure 18:
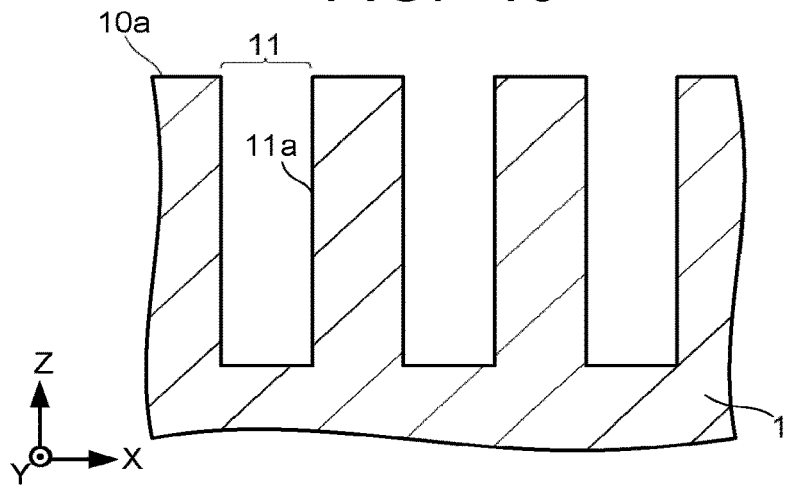
FIG. 18 is a view for explaining the example of the method of manufacturing the semiconductor wafer 1 including the surface 10a including the groove 11 having the shape illustrated in each of FIG. 12 to FIG. 15.

FIG. 16 to FIG. 18 are views for explaining an example of a method of manufacturing the semiconductor wafer 1 including the surface 10a including the groove 11 having a shape illustrated in each of FIG. 12 to FIG. 15. The example of the method of manufacturing the semiconductor wafer 1 includes a catalyst layer formation step, an etching step, and a catalyst layer removal step.

In the catalyst layer formation step, a catalyst layer 2 is formed on the surface 10a of the semiconductor wafer 1, as illustrated in FIG. 16. The catalyst layer 2 contains a catalyst of noble metal such as, for example, gold, silver, platinum, iridium, or palladium. The catalyst layer 2 can be formed by using, for example, sputtering, a CVD method, a plating method, or the like. The catalyst layer 2 may also contain a catalyst of a carbon material such as graphene.

In the etching step, the semiconductor wafer 1 is immersed in an etching solution. As the etching solution, it is possible to use a mixed solution of hydrofluoric acid and a hydrogen peroxide solution, for example.

When the semiconductor wafer 1 is immersed in the etching solution, a material (silicon, for example) of the surface 10a is dissolved in the etching solution, at a contact portion between the surface 10a and the catalyst layer 2. When this reaction repeatedly occurs, the semiconductor wafer 1 is etched almost vertically, as illustrated in FIG. 17.

In the catalyst layer removal step, the catalyst layer 2 is removed from the surface 10a, as illustrated in FIG. 18. The catalyst layer 2 is removed by impregnating the semiconductor wafer 1 with a chemical solution such as aqua regia, for example.

Even when the catalyst layer 2 is removed, a slight amount of catalyst atoms 2a contained in the catalyst layer 2 sometimes remains inside or on a surface of the semiconductor wafer 1. A surface density of the catalyst atoms 2a inside and on the surface of the semiconductor wafer 1 after removal of the catalyst layer 2 is, for example, $1 \times 10^{11}$ atoms/cm$^2$ or less.

The depression 11c having the shape as illustrated in each of FIG. 12 to FIG. 15 can be formed by performing etching on the semiconductor wafer 1 by using the catalyst layer 2 having a planar shape processed in a desired shape. Similarly to the first embodiment, the depressions 11c having a cross-sectional shape as illustrated in FIG. 2 may be formed by alternately switching the MACE using the first etching solution and the MACE using the second etching solution.

By manufacturing the semiconductor wafer 1 by using the MACE as described above, even when the groove 11 having a large depth D and a large aspect ratio is formed, it can be formed easily.

As described above, in the present embodiment, by forming the depressions 11c on the groove 11, it is possible to increase the surface area of the semiconductor wafer 1.

The present embodiment can be appropriately combined with another embodiment.

Third Embodiment

Figure 19:
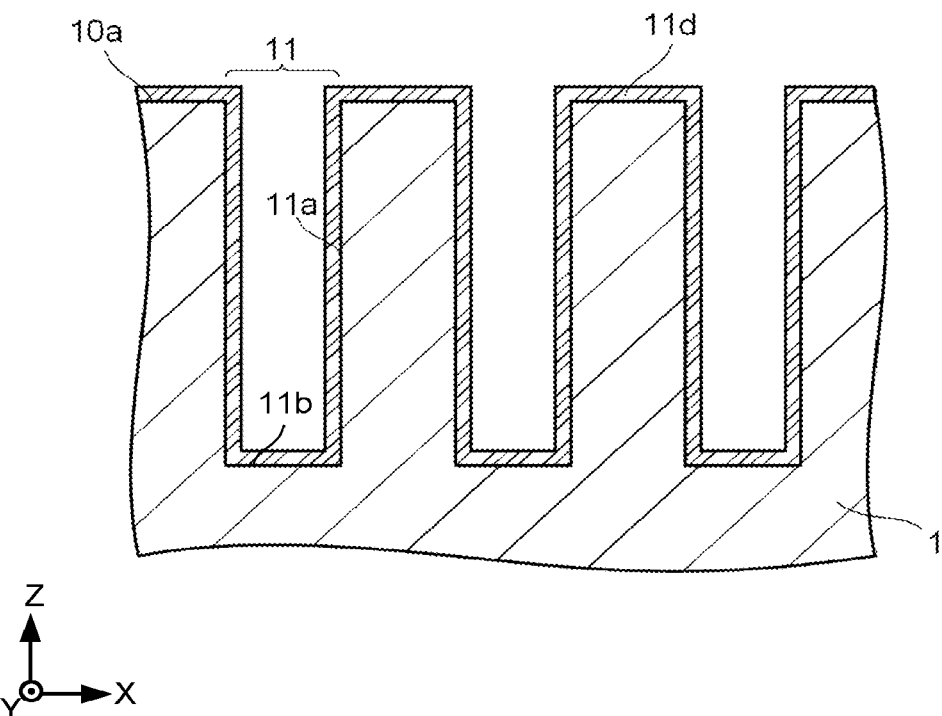
FIG. 19 is a schematic sectional view illustrating another structural example of the semiconductor wafer.
Figure 20:
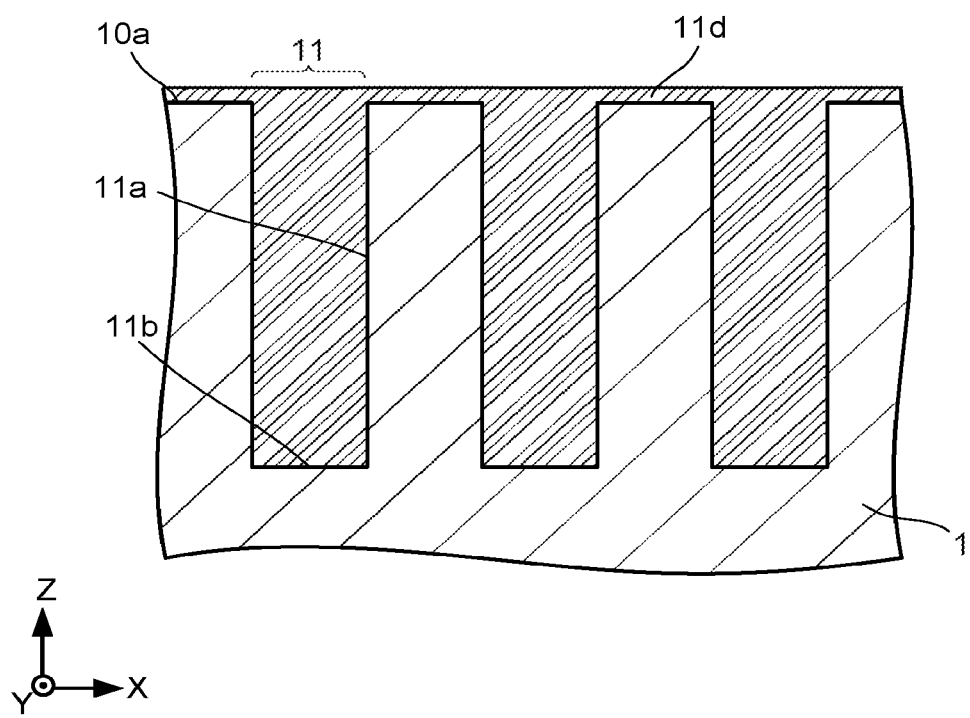
FIG. 20 is a schematic sectional view illustrating another structural example of the semiconductor wafer.

In the present embodiment, other structural examples of the semiconductor wafer 1 will be described. Each of FIG. 19 and FIG. 20 is a schematic sectional view illustrating another structural example of the semiconductor wafer 1, and illustrates a part of an X-Z cross section. The explanation can be appropriately cited for a part same as that of the explanation of the semiconductor wafer 1 described above.

The semiconductor wafer 1 illustrated in FIG. 19 includes a groove 11 provided on a surface 10a, and having an inner wall surface 11a and an inner bottom surface 11b, and a porous region 11d provided to face the inner wall surface 11a and the inner bottom surface 11b. The porous region 11d is exposed. A shape of the groove 11 is not particularly limited, but explanation will be made here as a line-shaped groove.

The porous region 11d is a porous film such as, for example, a silicon oxide film or a silicon oxide film containing doped carbon, and has a large number of pores in the film. An average diameter of the pores is 0.5 nm or more, for example. These porous films can be formed on the surface 10a through a coating method or a CVD method, for example, after forming the groove 11 on the semiconductor wafer 1 by a method similar to that of the second embodiment. The porous region 11d does not always have to have a film shape.

A shape of the porous region 11d changes depending on conditions such as a thickness of film and a forming method. FIG. 20 is a schematic sectional view illustrating an example of another shape of the porous region 11d. As illustrated in FIG. 20, it is also possible to fill the groove 11 with the porous region 11d.

As described above, in the present embodiment, the groove 11 is formed on the semiconductor wafer 1, and then the porous region 11d is further formed on the groove 11, which enables to increase the surface area of the semiconductor wafer 1.

The present embodiment can be appropriately combined with another embodiment.

Fourth Embodiment

Figure 21:
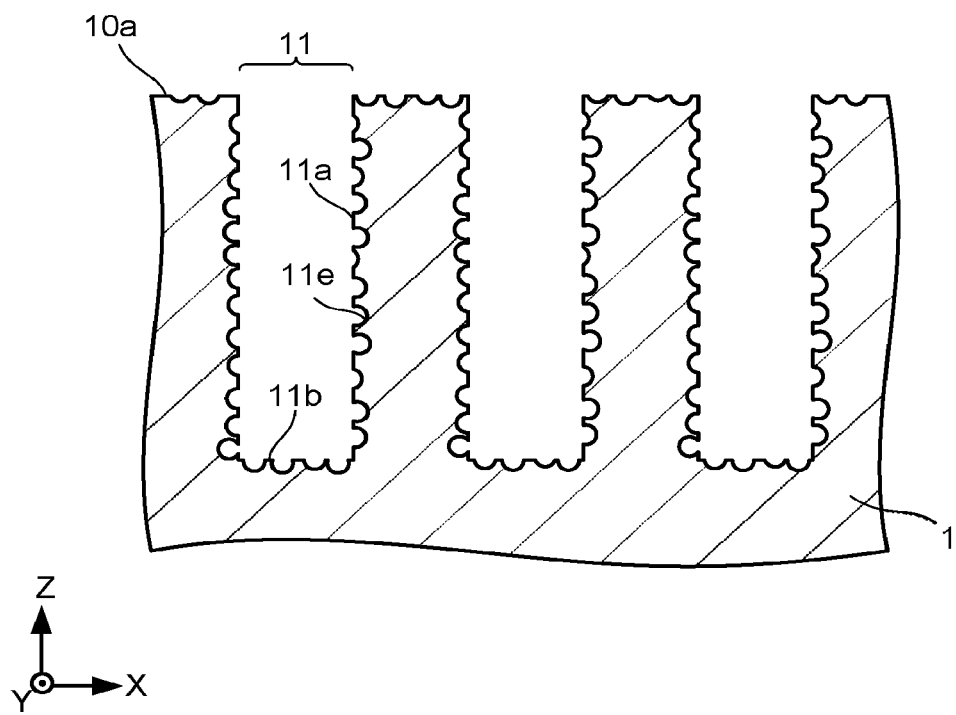
FIG. 21 is a schematic sectional view illustrating another structural example of the semiconductor wafer.

In the present embodiment, another structural example of the semiconductor wafer 1 will be described. FIG. 21 is a schematic sectional view illustrating another structural example of the semiconductor wafer 1, and illustrates a part of an X-Z cross section. The explanation can be appropriately cited for a part same as that of the explanation of the semiconductor wafer 1 described above.

The semiconductor wafer 1 illustrated in FIG. 21 includes a groove 11 provided on a surface 10a, and having an inner wall surface 11a and an inner bottom surface 11b, and a porous region 11e that faces the inner wall surface 11a and the inner bottom surface 11b. The inner wall surface 11a, the inner bottom surface 11b, and the porous region 11d are exposed. A shape of the groove 11 is not particularly limited, but explanation will be made here as a line-shaped groove.

The porous region 11e is a porous surface provided to the inner wall surface 11a and the inner bottom surface 11b. A surface of the porous surface has plural depressions (holes). The plural holes have an average diameter of 5 nm or more and 100 nm or less, and extend along the X axis direction, for example. At least one of the plural holes may penetrate from one of the plural grooves 11 to another groove 11 among the plural grooves 11.

Figure 22:
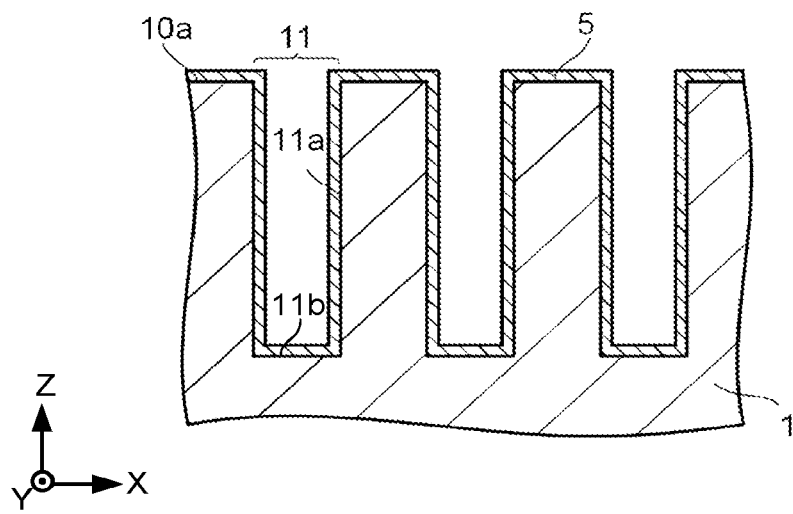
FIG. 22 is a schematic view for explaining an example of a method of manufacturing the semiconductor wafer illustrated in FIG. 21.
Figure 23:
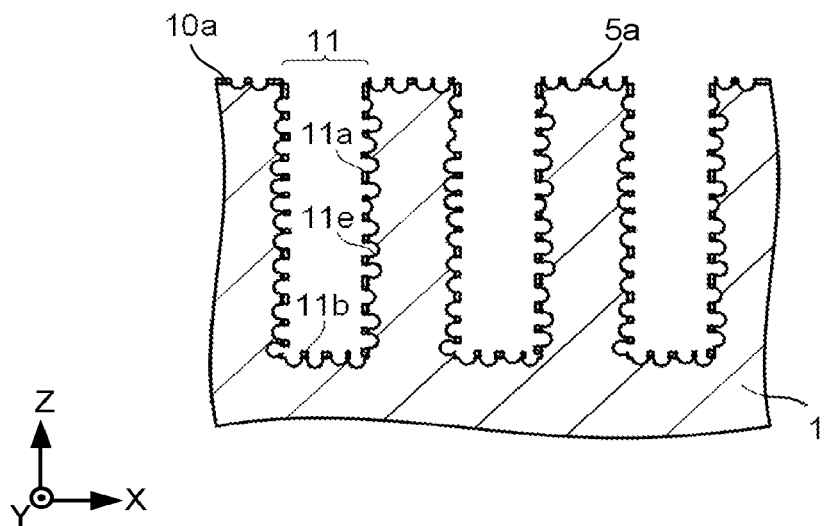
FIG. 23 is a schematic view for explaining the example of the method of manufacturing the semiconductor wafer illustrated in FIG. 21.
Figure 24:
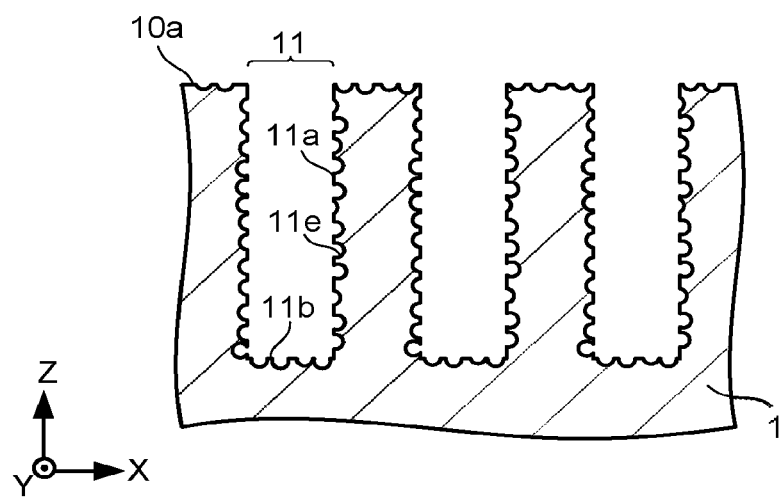
FIG. 24 is a schematic sectional view illustrating another structural example of the semiconductor wafer illustrated in FIG. 21.

FIG. 22 to FIG. 24 are views for explaining an example of a method of manufacturing the semiconductor wafer 1 illustrated in FIG. 21. The example of the method of manufacturing the semiconductor wafer includes a first catalyst layer formation step, a first etching step, a first catalyst layer removal step, a second catalyst layer formation step, a second etching step, and a second catalyst layer removal step. The first catalyst layer formation step, the first etching step, and the first catalyst layer removal step are the same as the catalyst layer formation step, the etching step, and the catalyst layer removal step, respectively, in the second embodiment, and thus explanations thereof will be omitted here.

In the second catalyst layer formation step, a catalyst layer 5 is formed on the surface 10a of the semiconductor wafer 1, as illustrated in FIG. 22. The catalyst layer 5 contains a catalyst of noble metal such as, for example, gold, silver, platinum, iridium, or palladium. The catalyst layer 5 can be formed by using, for example, sputtering, a CVD method, a plating method, or the like. The catalyst layer 5 may also contain a catalyst of a carbon material such as graphene.

In the second etching step, the MACE is used and the semiconductor wafer 1 is immersed in an etching solution. As the etching solution, it is possible to use a mixed solution of hydrofluoric acid and a hydrogen peroxide solution, for example.

When the semiconductor wafer 1 is immersed in the etching solution, a material (silicon, for example) of the surface 10a is dissolved in the etching solution, at a contact portion between the surface 10a and the catalyst layer 5. When this reaction repeatedly occurs, the semiconductor wafer 1 is etched and the porous region 11e is formed, as illustrated in FIG. 23. The surface 10a of the etched semiconductor wafer 1 includes a residue 5a of the catalyst layer 5.

In the second catalyst layer removal step, the residue 5a of the catalyst layer 5 is removed from the surface 10a, as illustrated in FIG. 24. The catalyst layer 5 is removed by impregnating the semiconductor wafer 1 with a chemical solution such as aqua regia, for example. The porous region 11e may be further etched by the chemical solution. At this time, catalyst atoms of the catalyst layer 5 sometimes remain, similarly to the first embodiment.

As described above, in the present embodiment, the groove 11 is formed on the semiconductor wafer 1, and then the porous region 11e is further formed on the groove 11, which enables to increase the surface area of the semiconductor wafer 1.

The present embodiment can be appropriately combined with another embodiment.

Fifth Embodiment

Figure 25:
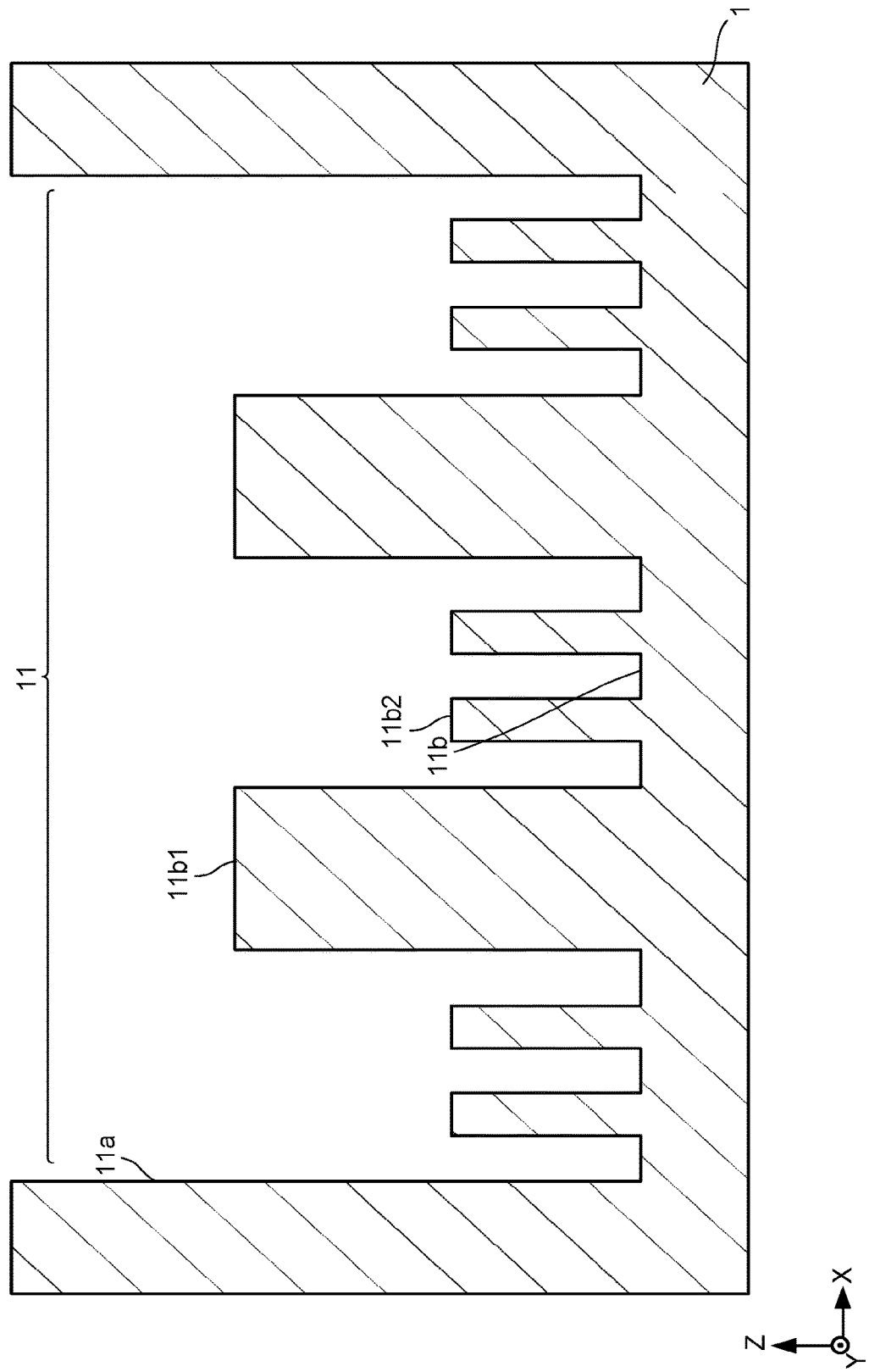
FIG. 25 is a schematic sectional view illustrating another structural example of the semiconductor wafer.

In the present embodiment, another structural example of the semiconductor wafer 1 will be described. FIG. 25 is a schematic sectional view illustrating another structural example of the semiconductor wafer 1, and illustrates a part of an X-Z cross section. The explanation can be appropriately cited for a part same as that of the explanation of the semiconductor wafer 1 described above.

A surface 10a of the semiconductor wafer 1 illustrated in FIG. 25 includes a groove 11. For the explanation of the groove 11, the explanation of the groove 11 of the embodiment can be appropriately cited.

The groove 11 has an inner wall surface 11a, an inner bottom surface 11b, a protrusion 11b1 provided to the inner bottom surface 11b, and a protrusion 11b2 provided to the inner bottom surface 11b. The inner wall surface 11a has a height in a direction that intersects the inner bottom surface 11b (Z axis direction). Although a planar shape of the groove 11 is not particularly limited, it is a line shape, for example. Although a width of the groove 11 in the X axis direction is not particularly limited, it is 100 μm or more, for example.

The protrusion 11b1 extends in the Z axis direction. A height in the Z axis direction of the protrusion 11b1 is lower than that of the inner wall surface 11a. FIG. 25 illustrates plural protrusions 11b1. Although a planar shape of the protrusion 11b1 is not particularly limited, it is a line shape, for example. Although an interval between adjacent protrusions 11b1 in the X axis direction is not particularly limited, it is 10 μm or more and less than 100 μm, for example.

The protrusion 11b2 extends in the Z axis direction. A height in the Z axis direction of the protrusion 11b2 is lower than that of the protrusion 11b1. FIG. 25 illustrates plural protrusions 11b2. The plural protrusions 11b2 are provided between the protrusions b1. Although a planar shape of the protrusion 11b2 is not particularly limited, it is a line shape, for example. Although an interval between adjacent protrusions 11b2 in the X axis direction is not particularly limited, it is 1 μm or more and less than 10 μm, for example.

Each of the groove 11, the protrusion 11b1, and the protrusion 112 can be formed by using the MACE, similarly to the second embodiment, for example. For instance, a first groove can be formed through the MACE using the catalyst layer 2 having a first width, a second groove can be formed on an inner bottom surface of the first groove through the MACE using the catalyst layer 2 having a second width which is smaller than the first width, and a third groove can be formed on an inner bottom surface of the second groove through the MACE using the catalyst layer 2 having a third width which is smaller than the second width.

As described above, in the present embodiment, by forming the plural protrusions (the protrusion 11b1, the protrusion 11b2) on the groove 11 of the semiconductor wafer 1, it is possible to increase the surface area of the semiconductor wafer 1.

The present embodiment can be appropriately combined with another embodiment.

Sixth Embodiment

Figure 26:
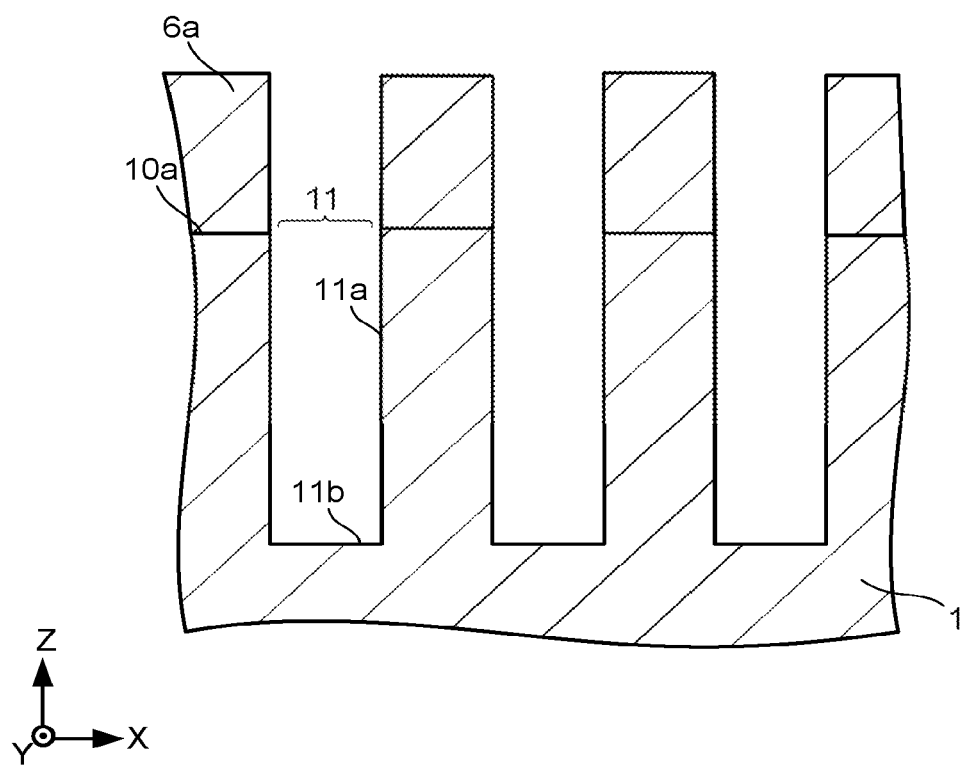
FIG. 26 is a schematic sectional view illustrating another structural example of the semiconductor wafer.

In the present embodiment, another structural example of the semiconductor wafer 1 will be described. FIG. 26 is a schematic sectional view illustrating another structural example of the semiconductor wafer 1. The explanation can be appropriately cited for a part same as that of the explanation of the semiconductor wafer 1 described above.

The semiconductor wafer 1 illustrated in FIG. 26 includes a surface 10a having a groove 11 including an inner wall surface 11a and an inner bottom surface 11b, and a semiconductor layer 6a provided on the surface 10a. The inner wall surface 11a, the inner bottom surface 11b, and the semiconductor layer 6a are exposed. A shape of the groove 11 is not particularly limited, but explanation will be made here as a line-shaped groove. The semiconductor layer 6a is provided to a region of the surface 10a, except for the groove 11, for example, and extends along the inner wall surface 11a.

The semiconductor layer 6a is an epitaxial layer formed by causing epitaxial growth of a material (silicon, for example) same as that of the semiconductor wafer 1 on the surface 10a, for example. As illustrated in FIG. 26, there is a case where an interface exists between the semiconductor layer 6a and the surface 10a of the semiconductor wafer 1.

As described above, in the present embodiment, the inner wall surface 11a can be extended by forming the semiconductor layer 6a on the surface 10a of the semiconductor wafer 1, and thus it is possible to increase the surface area of the semiconductor wafer 1.

The present embodiment can be appropriately combined with another embodiment.

Seventh Embodiment

Figure 27:
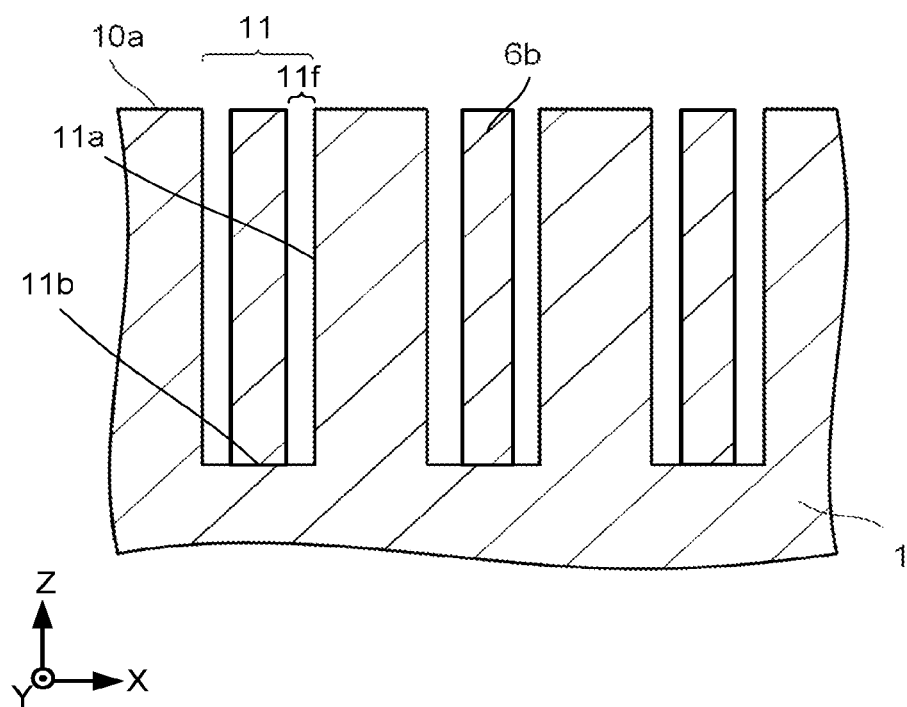
FIG. 27 is a schematic sectional view illustrating another structural example of the semiconductor wafer.

In the present embodiment, another structural example of the semiconductor wafer 1 will be described. FIG. 27 is a schematic sectional view illustrating another structural example of the semiconductor wafer 1. The explanation can be appropriately cited for a part same as that of the explanation of the semiconductor wafer 1 described above.

The semiconductor wafer 1 illustrated in FIG. 27 includes a surface 10a having a groove 11 including an inner wall surface 11a and an inner bottom surface 11b, and a semiconductor layer 6b provided on the surface 10a. The inner wall surface 11a, a part of the inner bottom surface 11b, and the semiconductor layer 6b are exposed. A shape of the groove 11 is not particularly limited, but explanation will be made here as a line-shaped groove.

The semiconductor layer 6b is provided on a part of the inner bottom surface 11b. At this time, there is formed a groove 11f between the semiconductor layer 6b and the inner wall surface 11a.

FIG. 28 to FIG. 32 are views for explaining an example of a method of manufacturing the semiconductor wafer illustrated in FIG. 27. The example of the method of manufacturing the semiconductor wafer includes a catalyst layer formation step, a first etching step, a catalyst layer removal step, a first film formation step, a second etching step, a second film formation step, a third etching step, and a fourth etching step. The catalyst layer formation step, the first etching step, and the catalyst layer removal step are the same as the catalyst layer formation step, the etching step, and the catalyst layer removal step, respectively, of the second embodiment, and thus explanations thereof will be omitted here.

Figure 28:
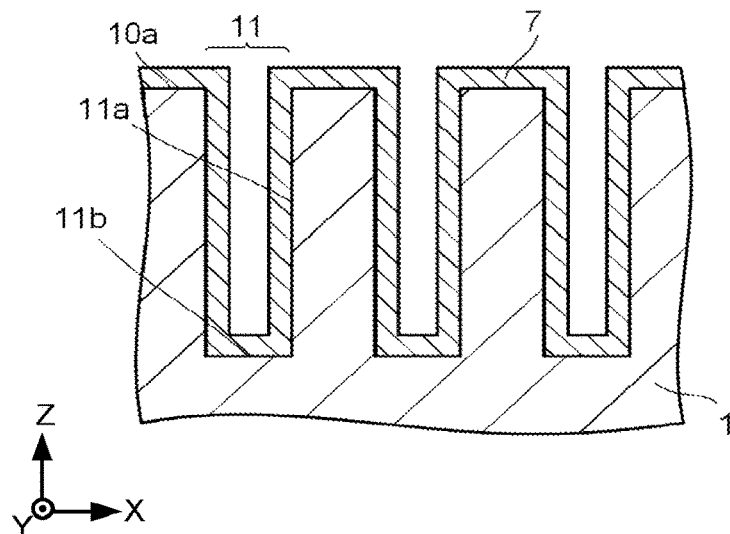
FIG. 28 is a schematic view for explaining an example of a method of manufacturing the semiconductor wafer illustrated in FIG. 27.

In the first film formation step, a film 7 is formed on the surface 10a of the semiconductor wafer 1, as illustrated in FIG. 28. The film 7 is formed on a region of the surface 10 except for the groove 11, the inner wall surface 11a, and the inner bottom surface 11b. The film 7 preferably contains a material having a high etching selection ratio with respect to the material of the semiconductor wafer 1, and it contains a material such as silicon oxide, silicon nitride, or silicon oxynitride, for example. The film 7 can be formed by using sputtering, a CVD method, a plating method, or the like, for example.

Figure 29:
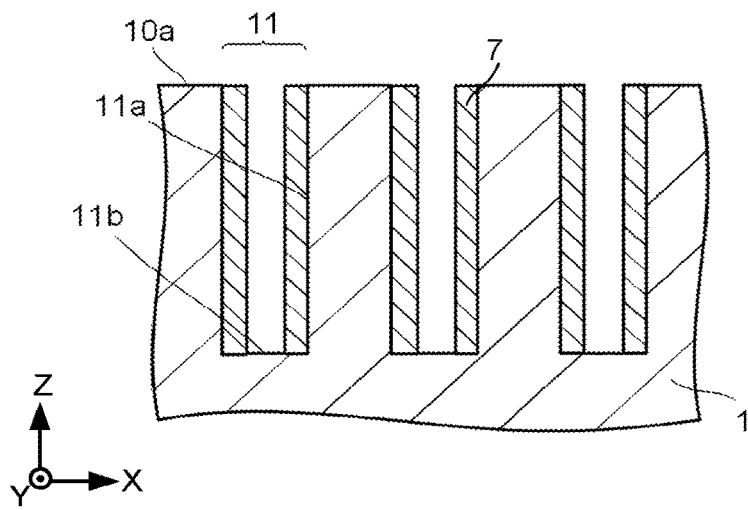
FIG. 29 is a schematic view for explaining the example of the method of manufacturing the semiconductor wafer illustrated in FIG. 27.

In the second etching step, the film 7 is partially etched by an etching method such as reactive ion etching, to thereby expose the region of the surface 10a except for the groove 11, and the inner bottom surface 11b, as illustrated in FIG. 29. A part of the film 7 remains along the inner wall surface 11a.

Figure 30:
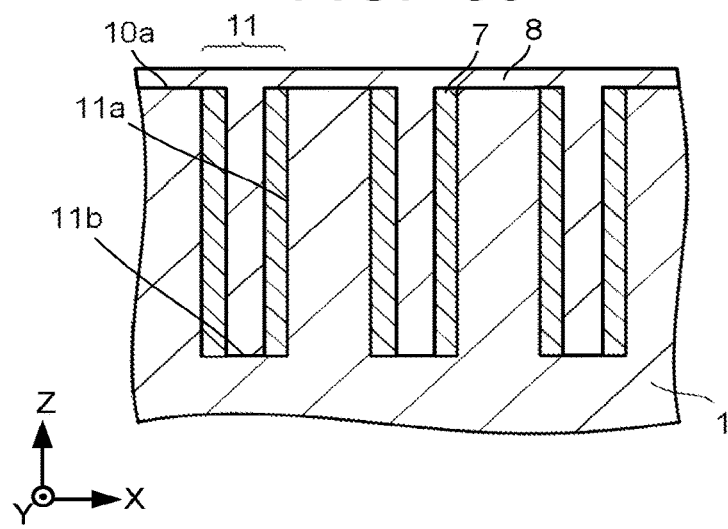
FIG. 30 is a schematic view for explaining the example of the method of manufacturing the semiconductor wafer illustrated in FIG. 27.

In the second film formation step, a film 8 is formed on the surface 10a of the semiconductor wafer 1, as illustrated in FIG. 30. The film 8 is formed on the exposed region of the surface 10a except for the groove 11, the film 7, and the inner bottom surface 11b. The film 8 is a silicon film, for example. The film 8 can be formed by using sputtering, a CVD method, a plating method, or the like, for example.

Figure 31:
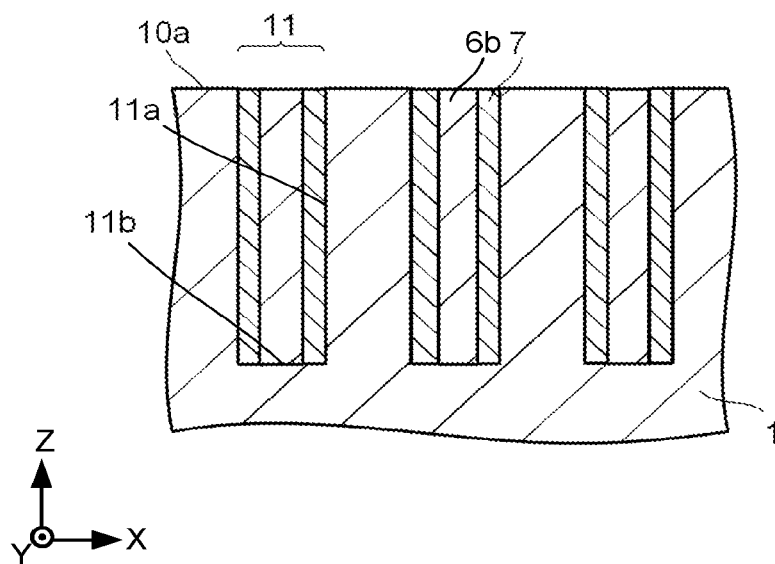
FIG. 31 is a schematic view for explaining the example of the method of manufacturing the semiconductor wafer illustrated in FIG. 27.

In the third etching step, the film 8 is partially etched by etching such as reactive ion etching or wet etching, to thereby expose an upper end of a residue of the film 7, and form the semiconductor layer 6, as illustrated in FIG. 31.

Figure 32:
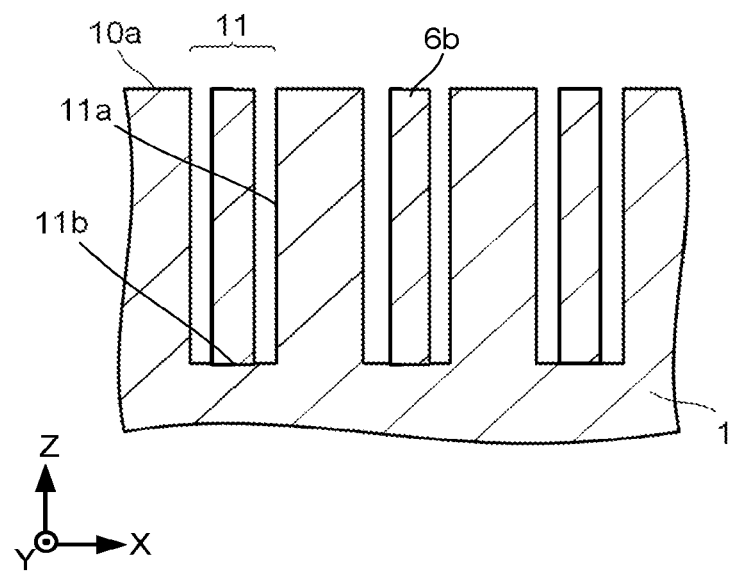
FIG. 32 is a schematic view for explaining the example of the method of manufacturing the semiconductor wafer illustrated in FIG. 27.

In the fourth etching step, the residue of the film 7 is etched by an etching method of wet etching or the like, to thereby remove the residue of the film 7 facing the inner wall surface 11a, as illustrated in FIG. 32. Consequently, the semiconductor layer 6b can be formed.

As described above, in the present embodiment, the semiconductor layer 6b is formed on the surface 10a of the semiconductor wafer 1, to thereby further form the groove 11f, which enables to increase the surface area of the semiconductor wafer 1.

The present embodiment can be appropriately combined with another embodiment.

Eighth Embodiment

Figure 33:
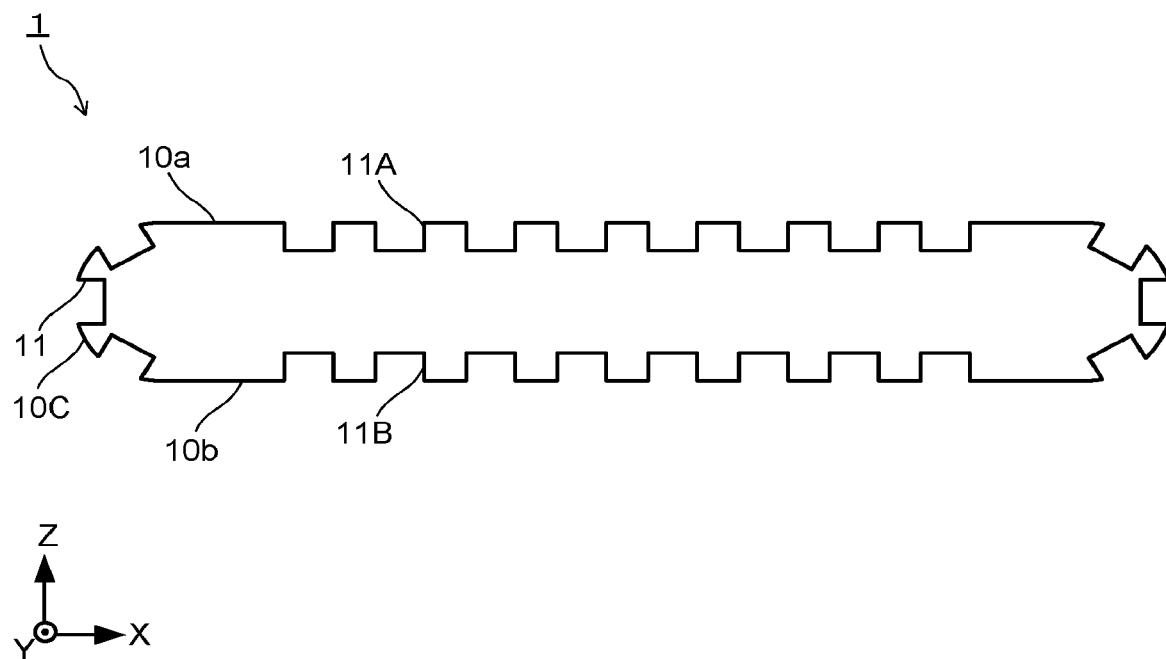
FIG. 33 is a schematic sectional view illustrating another structural example of the semiconductor wafer.

In the present embodiment, another structural example of the semiconductor wafer 1 will be described. FIG. 33 is a schematic sectional view illustrating another structural example of the semiconductor wafer 1. The explanation can be appropriately cited for a part same as that of the explanation of the semiconductor wafer 1 described above.

The semiconductor wafer 1 illustrated in FIG. 33 includes a surface 10a having a groove 11A, a surface 10b provided on an opposite side of the surface 10a and having a groove 11B, and a bevel surface 10c extending from the surface 10a or the surface 10b and having a groove 11C. A shape of each of the groove 11A, the groove 11B, and the groove 11C is not particularly limited, but explanation will be made here as a line-shaped groove having exposed inner wall surface and inner bottom surface.

Figure 34:
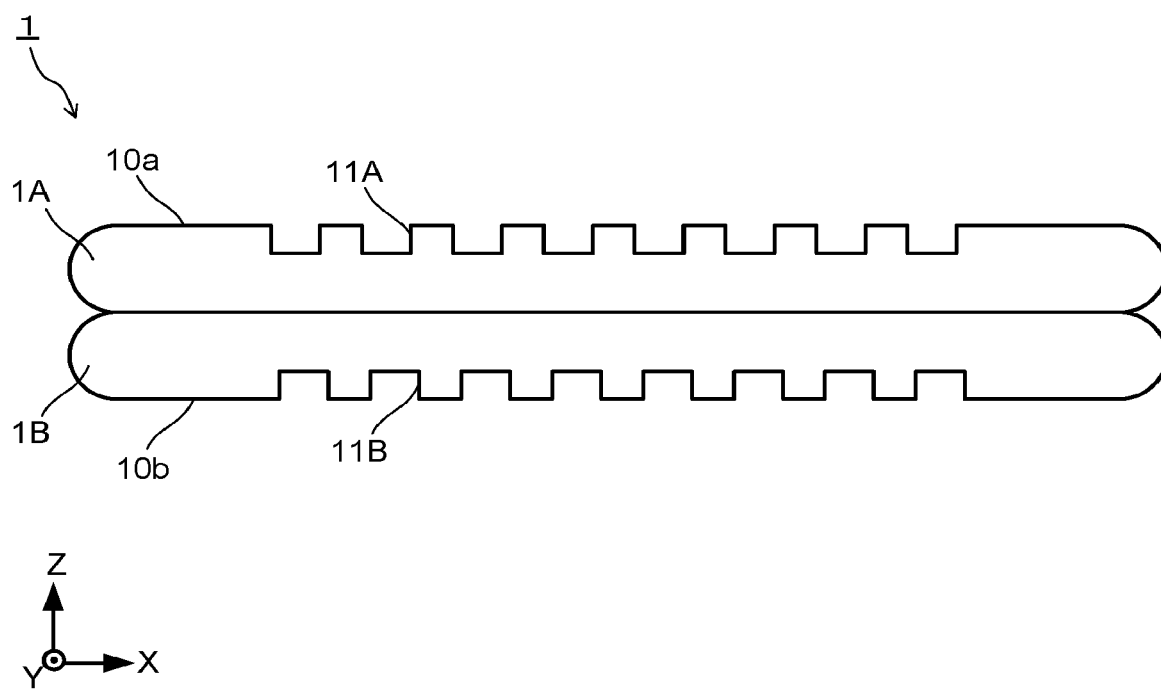
FIG. 34 is a schematic sectional view illustrating another structural example of the semiconductor wafer.

The semiconductor wafer 1 of the present embodiment is not limited to one having the structure illustrated in FIG. 33. FIG. 34 is a schematic sectional view illustrating another structural example of the semiconductor wafer 1. The explanation can be appropriately cited for a part same as that of the explanation of the semiconductor wafer 1 described above.

The semiconductor wafer 1 illustrated in FIG. 34 includes a first semiconductor wafer 1A having a surface 10a having a groove 11A, and a second semiconductor wafer 1B having a surface 10b having a groove 11B. The first semiconductor wafer 1A and the second semiconductor wafer 1B are bonded through thermal bonding, for example. A shape of each of the groove 11A and the groove 11B is not particularly limited, but explanation will be made here as a line-shaped groove.

As described above, in the present embodiment, by forming the groove 11 on the plural surfaces, it is possible to increase the surface area of the semiconductor wafer 1.

The present embodiment can be appropriately combined with another embodiment.

Ninth Embodiment

In the present embodiment, an example in which the semiconductor wafer 1 is used as a dummy wafer in a manufacturing step of a semiconductor device, as an example of a method of using a semiconductor wafer, will be described by using FIG. 35 to FIG. 38.

Figure 35:
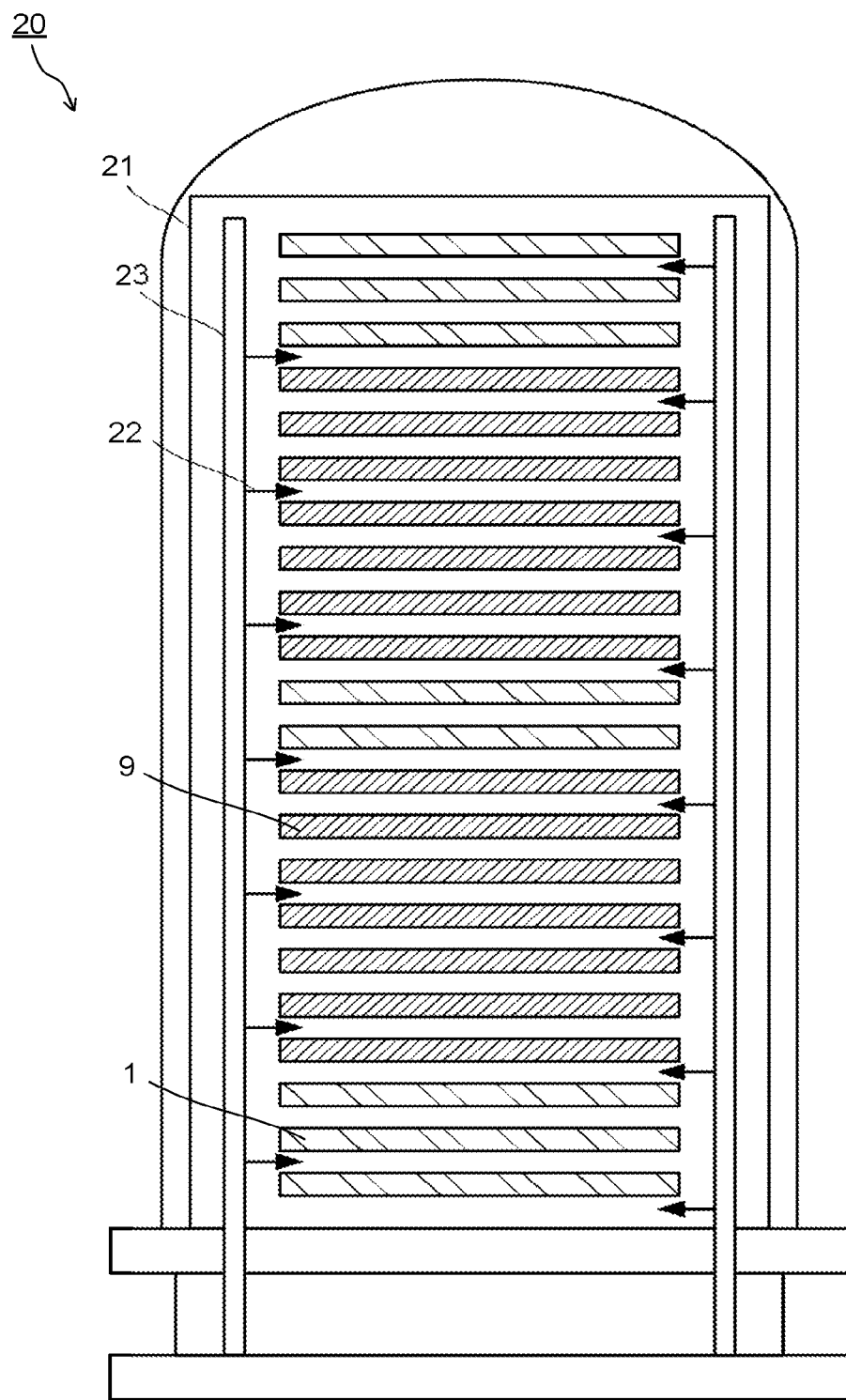
FIG. 35 is a schematic view illustrating a configuration example of a semiconductor manufacturing apparatus.

FIG. 35 is a schematic view illustrating a configuration example of a semiconductor manufacturing apparatus. FIG. 35 illustrates a configuration example of LP-CVD (Low Pressure Chemical Vapor Deposition) apparatus. A semiconductor manufacturing apparatus 20 illustrated in FIG. 35 includes a processing chamber 21, and a pipe 23 for supplying a source gas 22 into the processing chamber 21. The LP-CVD apparatus 20 further includes a vacuum pump, a heater, an exhaust system, a power source, a control circuit, and so on which are not illustrated.

There is a case where the semiconductor wafer 1 as a dummy wafer is conveyed, together with a device wafer 9 being a semiconductor wafer on which a semiconductor device is already formed or in the middle of the formation, into the same processing chamber 21, and the semiconductor wafer 1 and the device wafer 9 are processed simultaneously. An example of a method of manufacturing the semiconductor device of this case includes a step of placing the device wafer 9 in the processing chamber 21, a step of placing the semiconductor wafer 1 of the embodiment in the processing chamber 21, and a step of performing processing on the device wafer 9 and the semiconductor wafer 1 simultaneously in the processing chamber 21. The device wafer 9 and the semiconductor wafer 1 are placed in the processing chamber 21 through the same step or different steps.

FIG. 35 illustrates an example in which, when plural device wafers 9 are processed in the processing chamber 21, at least one semiconductor wafer 1 is placed in the processing chamber 21 together with the plural device wafers 9, and the wafers are subjected to film formation processing simultaneously. Although the number of the semiconductor wafer 1 to be placed is only required to be one or more, it is preferable to place plural semiconductor wafers 1, as illustrated in FIG. 35. Further, the semiconductor wafer 1 is preferably arranged at at least an upper region or a lower region in the processing chamber 21, as illustrated in FIG. 35.

Here, a structural example of the device wafer 9 will be described. A semiconductor device which is formed on the device wafer 9 is, for example, a three-dimensional NAND-type flash memory. Hereinafter, a film formation step when manufacturing the three-dimensional NAND-type flash memory will be described.

Figure 36:
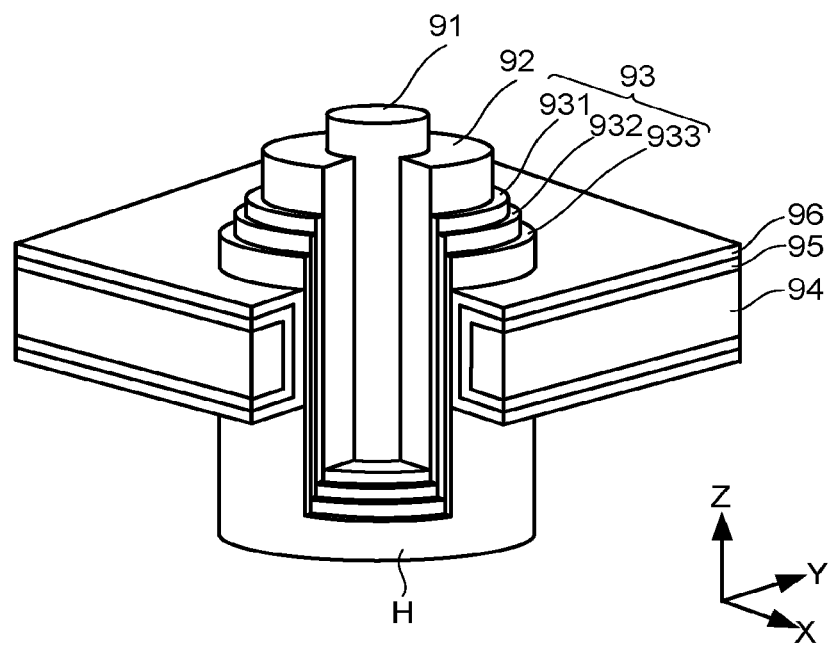
FIG. 36 is a schematic view illustrating a structural example of a semiconductor device.

FIG. 36 is a schematic view illustrating a structural example of a semiconductor device. The semiconductor device illustrated in FIG. 36 includes a core insulating film 91, a semiconductor channel layer 92, a memory film 93 including a tunnel insulating film 931, a charge storage layer 932, and a block insulating film 933, an electrode material layer 94, a metal layer 95, and an insulating layer 96. The electrode material layer 94 functions as a gate electrode (word line). The core insulating film 91, the semiconductor channel layer 92, and the memory film 93 are formed in a memory hole H, and configure a memory cell. The block insulating film 933 is a $SiO_2$ film (silicon oxide film), for example. The charge storage layer 932 is a SiN film (silicon nitride film), for example. The tunnel insulating film 931 is a stacked film including a $SiO_2$ film and a SiON film (silicon oxynitride film), for example. The semiconductor channel layer 92 is a polysilicon layer, for example. The core insulating film 91 is a $SiO_2$ film, for example. The electrode material layer 94, the metal layer 95, and the insulating layer 96 are a W layer (tungsten layer), a TiN film (titanium nitride film), and an $Al_2O_3$ film (aluminum oxide film), respectively, for example. In this case, the metal layer 95 functions as a barrier metal layer in the electrode layer described above, and the insulating layer 96 functions as a block insulating film together with the block insulating film 933.

Figure 37:
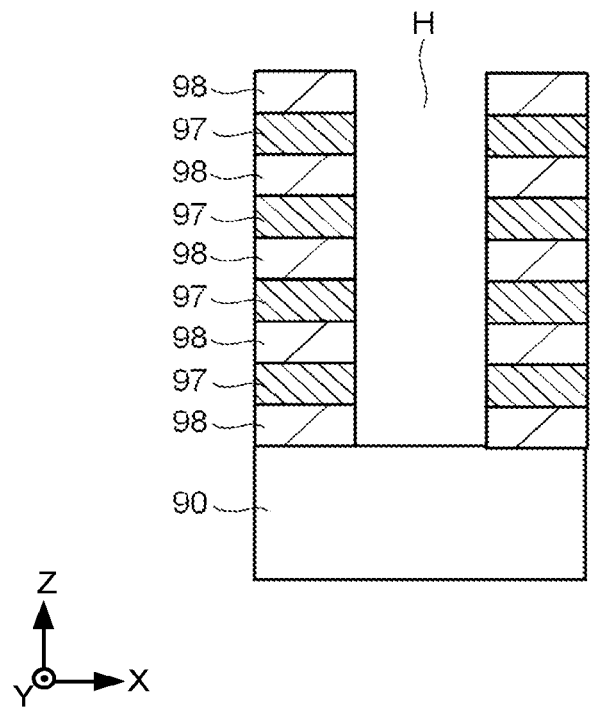
FIG. 37 is a schematic view for explaining an example a method of manufacturing the semiconductor device.

Next, an example of a method of manufacturing the semiconductor device illustrated in FIG. 36 will be described by using FIG. 37, FIG. 38, and FIG. 39. In FIG. 37, a stacked film in which plural sacrificial layers 97 and plural insulating layers 98 are alternately stacked is formed on a semiconductor wafer 90 such as a silicon wafer, and in these sacrificial layers 97 and insulating layers 98, the memory hole H being a groove is provided. The sacrificial layer 97 is a region in which the electrode material layer is to be formed later. The memory hole H is a region in which the memory film 93 is to be formed later.

The semiconductor wafer 1 is used for forming the memory film 93, the semiconductor channel layer 92, and the core insulating film 91, or forming the electrode material layer 94, the metal layer 95, and the insulating layer 96, and for modification treatment and etching process of those thin films including the sacrificial layers 97 and the insulating layers 98 configuring a side surface of the memory hole H, when manufacturing the semiconductor device, for example.

The formation of the memory film 93 is performed by making the device wafer 9 in a state where, as illustrated in FIG. 37, the memory hole H is formed in the stack in which the plural sacrificial layers 97 and the plural insulating layers 98 are alternately stacked to be conveyed into the processing chamber 21, to thereby form the block insulating film 933, the charge storage layer 932, and the tunnel insulating film 931 in this order in the memory hole H.

Figure 38:
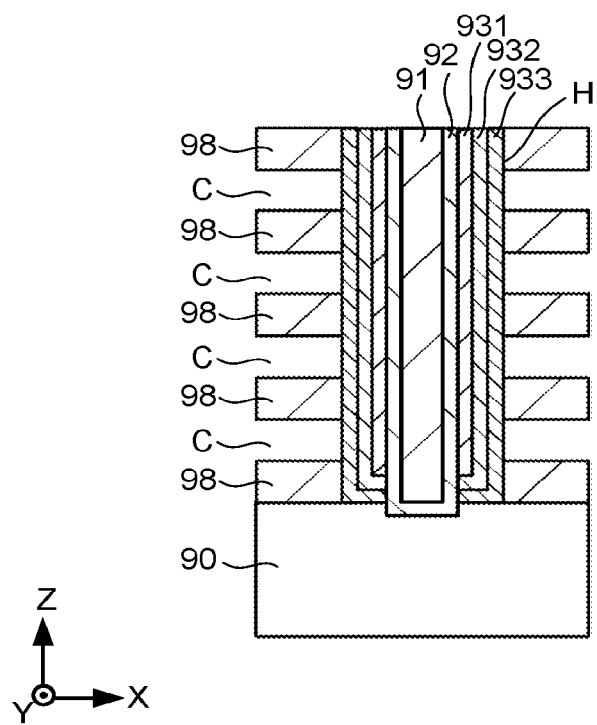
FIG. 38 is a schematic view for explaining the example the method of manufacturing the semiconductor device.
Figure 39:
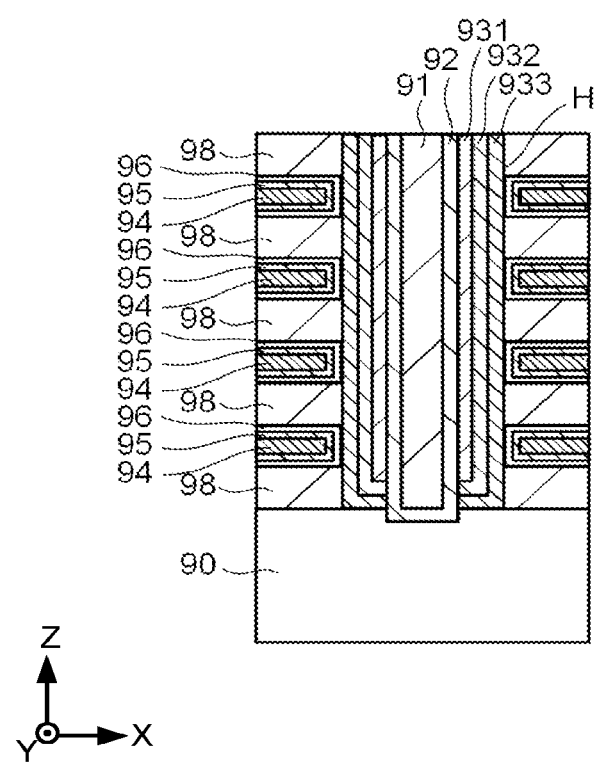
FIG. 39 is a schematic view for explaining the example the method of manufacturing the semiconductor device.

The formation of the metal layer 95 and the insulating layer 96 is performed by making the device wafer 9 on which the memory film 93 is formed and then the plural sacrificial layers are removed to provide a cavity C between the plural insulating layers 98 as illustrated in FIG. 38, to be conveyed into the processing chamber 21, to thereby form the insulating layer 96, the metal layer 95, and the electrode material layer 94 in this order in the cavity C (this is called a replacement step), as illustrated in FIG. 39.

The modification treatment includes oxidation caused by performing treatment using gas containing oxygen, nitridation caused by performing gas phase treatment using nitrogen-containing gas such as ammonia, and crystallization caused by performing heat treatment after or in the middle of the formation of respective layers or films in the formation step of the sacrificial layers 97 and the insulating layers 98, the block insulating film 933, the charge storage layer 932, the tunnel insulating film, and the semiconductor channel layer 92 in FIG. 37 and FIG. 38, for example. Further, the modification treatment includes treatment in which a sacrificial layer containing a desired impurity such as boron, phosphorus, or metal is formed after the formation of the layer or film, the impurity is diffused in a targeted layer or film by performing heat treatment, and then the sacrificial layer is etched to be removed. This also applies to the electrode material layer 94, the metal layer 95, and the insulating layer 96.

The etching process includes a process of reducing a thickness of, for example, each of the sacrificial layers 97 and the insulating layers 98 in FIG. 37, and the formed block insulating film 933, charge storage layer 932, tunnel insulating film, and semiconductor channel layer 92 in FIG. 38, after the formation thereof, by using an etching gas containing halogen such as fluorine, chlorine, or bromine, or the like. The same applies to the electrode material layer 94, the metal layer 95, and the insulating layer 96 in FIG. 39.

In each of the examples, at least one semiconductor wafer 1 is conveyed into the processing chamber 21 together with the plural device wafers 9, and the similar processing is performed. Consequently, when a desired processing result cannot be obtained at a specific position in the processing chamber 21, it is possible to use the semiconductor wafer 1 as a dummy wafer. Plural pieces of processing may be performed.

As described above, the semiconductor wafer 1 is formed with the plural grooves 11 so as to increase its surface area. Accordingly, the semiconductor wafer 1 becomes a dummy wafer having a surface area which is about the same as the surface area of the device wafer 9. Therefore, it is possible to further reduce a variation in film formation in the processing chamber 21 caused by a surface area difference, for example, resulting in that uniformity of the film thickness, the film composition, the film density, and so on between the device wafers 9 or within a plane of the device wafer 9 can be further improved. Specifically, it becomes possible to manufacture a semiconductor device with further improved reliability.

The semiconductor wafer 1 is used as the dummy wafer, so that a purity of semiconductor thereof may be lower than that of the device wafer 9. Accordingly, the semiconductor wafer 1 may have an electric resistivity lower than that of the device wafer 9, and it may have an impurity concentration higher than that of the device wafer 9.

The depth (the length in the Z axis direction) of the groove 11 of the semiconductor wafer 1 is larger than the depth (the length in the Z axis direction) of the memory hole MH formed on the device wafer 9.

Although the present usage example has been explained by citing the LP-CVD apparatus as an example, the semiconductor wafer 1 can also be applied to another semiconductor manufacturing apparatus. Further, the semiconductor device is not limited to the three-dimensional NAND-type flash memory, and it is also possible to apply another semiconductor device.

While certain embodiments of the present invention have been described, these embodiments have been presented by way of example only, and are not intended to limit the scope of the inventions. The novel embodiments described herein may be embodied in a variety of other forms; furthermore, various omissions, substitutions and changes may be made therein without departing from the spirit of the inventions. The accompanying claims and their equivalents are intended to cover such forms or modifications as would fall within the scope and spirit of the inventions.

Clauses based on the embodiments will be additionally described below.

(Clause 1) A semiconductor substrate, including
a surface having a groove, the groove including an inner bottom surface and an inner wall surface, the inner wall surface having a depression, the depression having a depth from a direction along a surface of the inner wall surface to a width direction of the groove, and
the substrate being exposed to the inner wall surface.

(Clause 2) The substrate according to clause 1, wherein:
the inner wall surface has a plurality of the depressions; and
the depressions are spaced along a depth direction of the groove or along an inner periphery of the groove.

(Clause 3) A semiconductor substrate, including:
a surface having a groove, the groove including an inner bottom surface and an inner wall surface; and
a porous region facing the inner bottom surface and the inner wall surface.

(Clause 4) A semiconductor substrate, including:
an inner bottom surface;
an inner wall surface having a height in a first direction, the first direction intersecting the inner bottom surface; and
a protrusion provided on the inner bottom surface, extending in the first direction, and being lower in a height in the first direction than the inner wall surface,
the substrate being exposed to the inner wall surface.

(Clause 5) The substrate according to clause 1, further including a semiconductor layer partly provided on the surface and extending along the inner wall surface.

(Clause 6) The substrate according to clause 1, further including a second surface provided on an opposite side of the surface and having a second groove, the second groove including a second inner wall surface.

(Clause 7) The substrate according to clause 1, wherein the substrate is a silicon wafer, a silicon carbide wafer, a glass wafer, a quartz wafer, a sapphire wafer, or a compound semiconductor wafer.

(Clause 8) A method of manufacturing a semiconductor device, including:
placing a first semiconductor substrate into a chamber, the first semiconductor substrate including a first surface and a film provided on the first surface, the film having a first groove;
placing a second semiconductor substrate into the chamber, the second semiconductor substrate being the substrate according to clause 1; and processing the first and second semiconductor substrates in the chamber.

(Clause 9) The method according to clause 8, wherein the film has first layers and second layers, each first layer and each second layer being alternately stacked.

(Clause 10) The method according to clause 8, wherein the processing includes at least one processing selected from the group consisting of film formation processing, an etching process, and modification treatment.

(Clause 11) The method according to clause 8, wherein a plurality of the second semiconductor substrates is placed into the chamber.

(Clause 12) A method of manufacturing a semiconductor substrate, including:
forming a catalyst layer onto a surface of a semiconductor substrate;

supplying a first liquid to the substrate with the catalyst layer, the first liquid containing hydrogen fluoride; and supplying a second liquid to the substrate with the catalyst layer after the supply of the first liquid, the second liquid containing hydrogen fluoride and being lower in a concentration of the hydrogen fluoride than the first liquid.

What is claimed is:

1. A semiconductor substrate, comprising
a surface having a groove, the groove including an inner bottom surface and an inner wall surface, the inner wall surface having a depression, the depression having a depth from a direction along a surface of the inner wall surface to a width direction of the groove, the inner bottom surface of the groove having protrusions with different heights and widths;
wherein some adjacent protrusions have an interval therebetween in a range of 10 μm or more and less than 100 μm, and other adjacent protrusions have an interval therebetween in a range of 1 μm or more and less than 10 μm.

2. The substrate according to claim 1, wherein:
the inner wall surface has a plurality of the depressions; and
the depressions are spaced along a depth direction of the groove or along an inner periphery of the groove.

3. The substrate according to claim 1, further comprising a semiconductor layer partly provided on the surface and extending along the inner wall surface.

4. The substrate according to claim 1, further comprising a second surface provided on an opposite side of the surface and having a second groove, the second groove including a second inner wall surface.

5. The substrate according to claim 1, wherein the substrate is a silicon wafer, a silicon carbide wafer, a glass wafer, a quartz wafer, a sapphire wafer, or a compound semiconductor wafer.

6. The substrate according to claim 1, wherein the substrate has a circular shape when viewed from a direction perpendicular to the surface.

7. The substrate according to claim 1, wherein the inner wall surface is perpendicular to an inner side surface of the depression.

* * * * *